(12) United States Patent
An et al.

(10) Patent No.: US 10,937,887 B2
(45) Date of Patent: Mar. 2, 2021

(54) SEMICONDUCTOR DEVICE

(71) Applicant: Samsung Electronics Co., Ltd., Suwon-si (KR)

(72) Inventors: Guk Il An, Goyang-si (KR); Keun Hwi Cho, Seoul (KR); Dae Won Ha, Seoul (KR); Seung Seok Ha, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/425,337

(22) Filed: May 29, 2019

(65) Prior Publication Data

US 2020/0013871 A1 Jan. 9, 2020

(30) Foreign Application Priority Data

Jul. 6, 2018 (KR) .......................... 10-2018-0078671
Nov. 2, 2018 (KR) .......................... 10-2018-0133386

(51) Int. Cl.
*H01L 29/51* (2006.01)
*H01L 23/522* (2006.01)
*H01L 27/088* (2006.01)
*H01L 29/78* (2006.01)
*H01L 49/02* (2006.01)

(52) U.S. Cl.
CPC ........ *H01L 29/516* (2013.01); *H01L 23/5226* (2013.01); *H01L 27/0886* (2013.01); *H01L 28/40* (2013.01); *H01L 29/785* (2013.01)

(58) Field of Classification Search
CPC ............ H01L 23/5226; H01L 27/0886; H01L 29/785; H01L 29/516; H01L 28/40; H01L 29/423; H01L 29/78
See application file for complete search history.

(56) References Cited

U.S. PATENT DOCUMENTS

| | | | |
|---|---|---|---|
| 8,247,855 B2 * | 8/2012 | Summerfelt | ...... H01L 27/11502 257/295 |
| 9,722,093 B1 | 8/2017 | Xing et al. | |
| 10,170,520 B1 * | 1/2019 | Frougier | ......... H01L 21/823431 |
| 2008/0048226 A1 | 2/2008 | Heo et al. | |
| 2016/0005749 A1 | 1/2016 | Li et al. | |
| 2017/0162702 A1 | 6/2017 | Hu | |
| 2018/0076334 A1 | 4/2018 | Ando et al. | |
| 2018/0151745 A1 | 5/2018 | Chang et al. | |
| 2018/0166582 A1 | 6/2018 | Liao et al. | |
| 2018/0226417 A1 * | 8/2018 | Ando | ................ H01L 27/11507 |
| 2019/0115444 A1 * | 4/2019 | Bentley | ................ H01L 29/516 |

* cited by examiner

*Primary Examiner* — Julia Slutsker
(74) *Attorney, Agent, or Firm* — Muir Patent Law, PLLC

(57) ABSTRACT

A semiconductor device includes a substrate, a gate structure on the substrate and a first conductive connection group on the gate structure. The gate structure includes a gate spacer and a gate electrode. The first conductive connection group includes a ferroelectric material layer. At least a part of the ferroelectric material layer is disposed above an upper surface of the gate spacer. And the ferroelectric material layer forms a ferroelectric capacitor having a negative capacitance in the first conductive connection group.

19 Claims, 27 Drawing Sheets

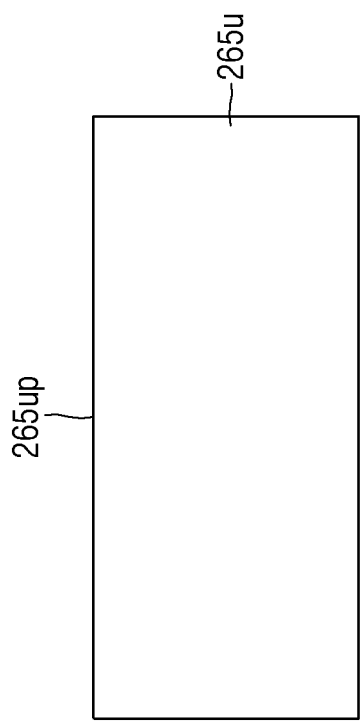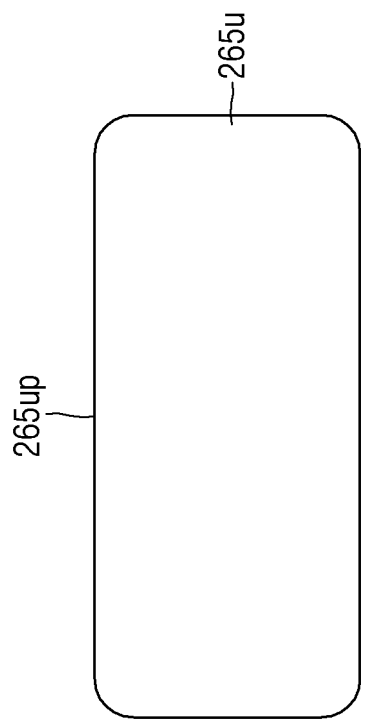

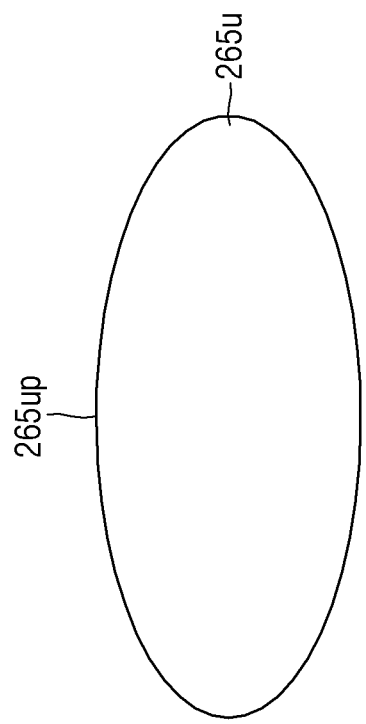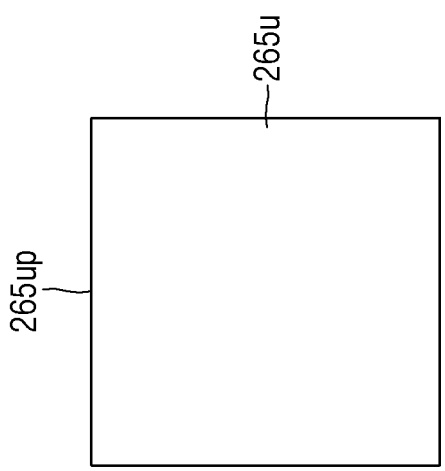

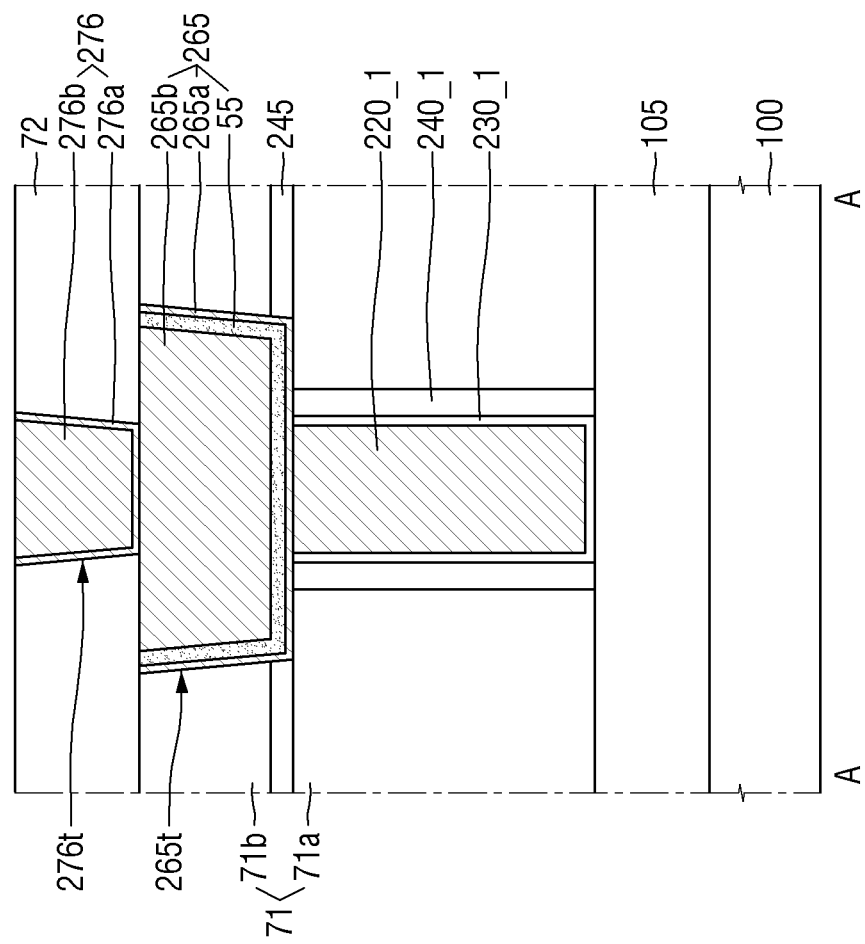

SEMICONDUCTOR DEVICE

CROSS-REFERENCE TO RELATED APPLICATION

This application claims priority under 35 U.S.C. § 119 to Korean Patent Application No. 10-2018-0078671, filed on Jul. 6, 2018, and Korean Patent Application No. 10-2018-0133386, filed on Nov. 2, 2018, in the Korean Intellectual Property Office, the disclosures of which are incorporated herein in their entirety by reference.

BACKGROUND

1. Field of the Disclosure

The present disclosure relates to a semiconductor device, and more specifically, to a semiconductor device which includes a negative capacitor having a negative capacitance using a ferroelectric material.

2. Description of the Related Art

After development of metal oxide semiconductor field effect transistors (MOSFETs), the degree of integration of integrated circuits has continuously increased. For example, the degree of integration of the integrated circuit shows a tendency that the total number of transistors per unit chip area is doubled every two years. In order to increase the degree of integration of the integrated circuit, the size of the individual transistor has continuously decreased. In addition, semiconductor technologies for improving the performance of miniaturized transistors have appeared.

In such semiconductor technologies, there may be a high-K metal gate (HKMG) technology which improves a gate capacitance and reduces a leakage current, and a FinFET technology capable of improving a SCE (short channel effect) in which potential of a channel region is affected by a drain voltage.

However, as compared with the miniaturization of the transistor size, lowering of a drive voltage of the transistor was not greatly improved. As a result, a power density of a complementary metal oxide (CMOS) transistor increases exponentially. In order to reduce the power density, a decrease in the power of the drive voltage is necessarily required. However, because a silicon-based MOSFET has thermal emission-based physical operating characteristics, it is difficult to achieve a very low supply voltage.

For this reason, the necessity of development of a transistor having a subthreshold swing below 60 mV/decade or less, which is known as a physical limit of the subthreshold swing (SS) at normal temperature, has emerged.

SUMMARY

According to an exemplary embodiment of the present inventive concept, a semiconductor device includes a substrate, a gate structure on the substrate and a first conductive connection group on the gate structure. The gate structure includes a gate spacer and a gate electrode. The first conductive connection group includes a ferroelectric material layer. At least a part of the ferroelectric material layer is disposed above an upper surface of the gate spacer. And the ferroelectric material layer forms a ferroelectric capacitor having a negative capacitance in the first conductive connection group.

According to an exemplary embodiment of the present inventive concept, a semiconductor device includes a substrate, a gate structure including a gate electrode on the substrate, a source/drain region disposed in a region of the substrate adjacent to at least one side of the gate structure, a first conductive connection group disposed on the gate electrode and connected to the gate electrode, and a second conductive connection group connected to the source/drain region and disposed on the source/drain region. The first conductive connection group includes a ferroelectric material layer. The first conductive connection group includes a gate contact plug being in contact with the gate electrode. The second conductive connection group includes a source/drain contact plug being in contact with the source/drain region. An upper surface of the gate contact plug is positioned at substantially the same height as an upper surface of the source/drain contact plug from an upper surface of the substrate. A height from an upper surface of the gate structure to an uppermost surface of the ferroelectric material layer is equal to or greater than a height from the upper surface of the gate structure to the upper surface of the source/drain contact plug.

According to an exemplary embodiment of the present inventive concept, a semiconductor device includes a substrate including an active region and a field region, a first gate electrode on the substrate, the first gate electrode extending over the active region and the field region in a first direction, and a first gate contact plug on the first gate electrode, the first gate contact plug being connected to the first gate electrode and including a ferroelectric material layer. A width of the first gate contact plug in the first direction being smaller than a length of the first gate electrode in the first direction.

BRIEF DESCRIPTION OF THE DRAWINGS

The above and other aspects and features of the present disclosure will become more apparent by describing in detail example embodiments thereof with reference to the attached drawings, in which:

FIGS. 13a to 13e are diagrams for explaining an example shape that an upper surface of a second gate contact plug may have;

FIGS. 14 and 15 are diagrams for explaining a semiconductor device according to some embodiments of the present disclosure;

DETAILED DESCRIPTION OF THE EMBODIMENTS

Figure 1:
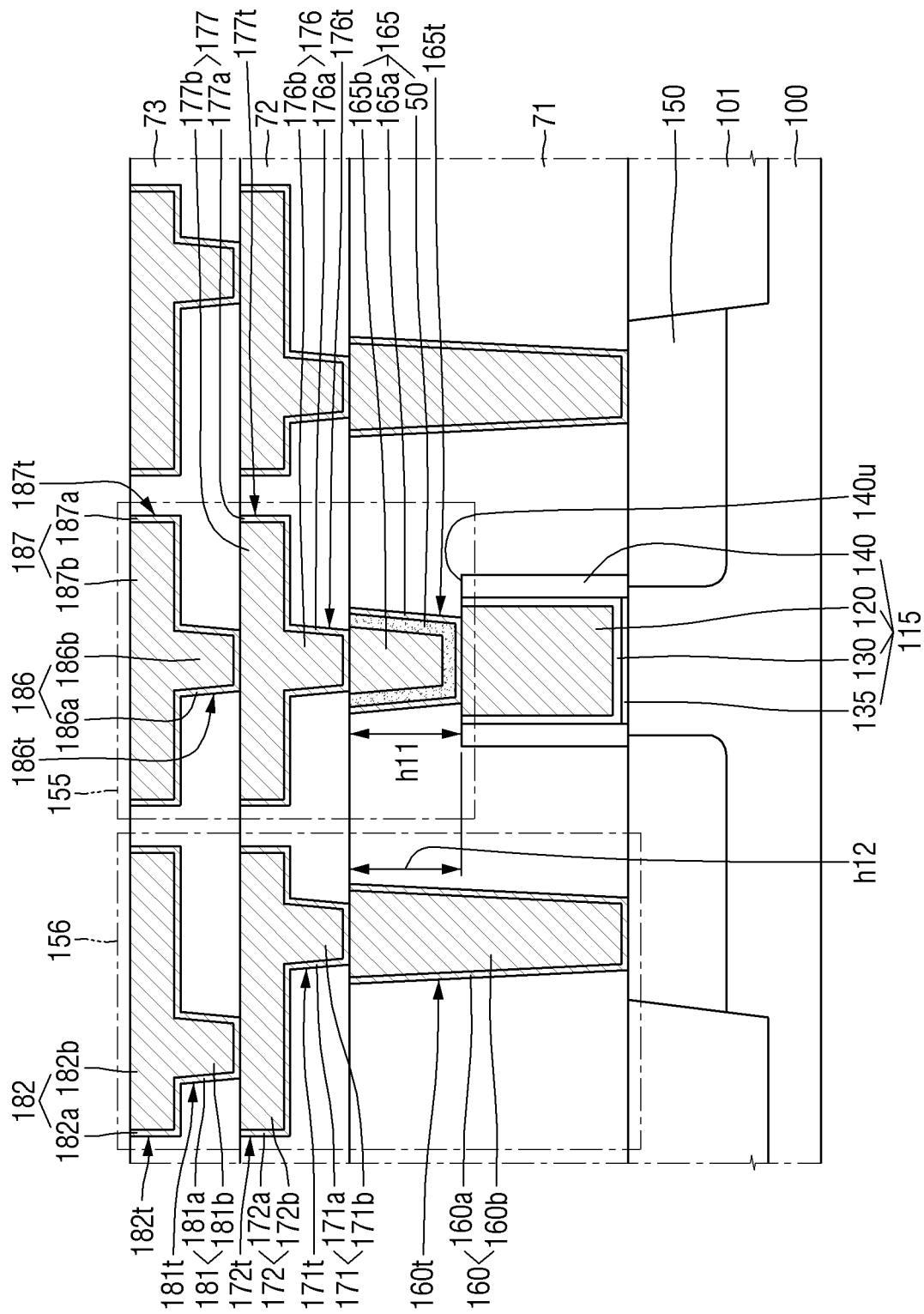
FIG. 1 is a diagram for explaining a semiconductor device according to some embodiments of the present disclosure.

In the drawings of the semiconductor device according to some embodiments of the present disclosure, a fin type transistor (FinFET) including a fin type pattern-shaped channel region or a planar transistor is exemplarily illustrated, but the disclosure is not limited thereto. It is a matter of course that the semiconductor device according to some embodiments of the present disclosure may include a tunneling FET, a transistor including a nanowire, a transistor including a nanosheet or a three-dimensional (3D) transistor. In addition, the semiconductor device according to some embodiments of the present disclosure may include a bipolar junction transistor, a lateral double diffused transistor (LDMOS) or the like.

FIG. 1 is a diagram for explaining the semiconductor device according to some embodiments of the present disclosure.

Referring to FIG. 1, the semiconductor device according to some embodiments of the present disclosure may include a first gate structure 115, a first source/drain region 150, a first conductive connection group 155, and a second conductive connection group 156.

The substrate 100 may be a bulk silicon substrate or a silicon-on-insulator (SOI) substrate. Alternatively, the substrate 100 may be a silicon substrate or may include, but is not limited to, other materials, for example, silicon germanium, silicon germanium on insulator (SGOI), indium antimonide, lead tellurium compound, indium arsenide, phosphide indium, gallium arsenide or gallium antimonide.

An element isolation film 101 may be formed in the substrate 100. The element isolation film 101 may define an active region. The element isolation film 101 may include, for example, at least one of silicon oxide, silicon oxynitride and silicon nitride.

The first gate structure 115 may be formed on the substrate 100. The first gate structure 115 may include a first gate spacer 140, a first gate electrode 120, a first interfacial layer 135, and a first gate insulating layer 130.

The first gate spacer 140 may be formed on the substrate 100. The first gate spacer 140 may define a space in which the first interfacial layer 135, the first gate insulating layer 130 and the first gate electrode 120 are formed.

The first gate spacer 140 may include, for example, at least one of silicon nitride (SiN), silicon oxynitride (SiON), silicon oxide ($SiO_2$), and silicon oxycarbonitride (SiOCN).

The first interfacial layer 135 may be formed on the substrate 100. The first interfacial layer 135 may be formed between two first gate spacers of the first gate spacer 140. Although the first interfacial layer 135 is illustrated as being formed only on the upper surface of the substrate 100, the disclosure is not limited thereto. Depending on the fabricating method, the first interfacial layer 135 may extend along the sidewalls of the first gate spacer 140.

When the substrate 100 contains silicon, the first interfacial layer 135 may include at least one of a silicon oxide layer, a silicon oxynitride layer and a silicon nitride layer.

The first gate insulating layer 130 may be formed on the first interfacial layer 135. The first gate insulating layer 130 may extend along the upper surface of the substrate 100 and the sidewalls of the first gate spacer 140.

The first gate insulating layer 130 may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

Unlike the illustrated case, the first gate insulating layer 130 may be formed only on the upper surface of the substrate 100 without extending along the sidewalls of the first gate spacer 140.

Also, unlike the illustrated case, the first gate insulating layer 130 may not be formed on the first interfacial layer 135. In addition, the first interfacial layer 135 may not be formed between the first gate insulating layer 130 and the substrate 100. For example, the first interfacial layer 135 may be omitted so that the first gate insulating layer 130 may be in contact with the upper surface of the substrate 100.

The first gate electrode 120 may be formed on the first gate insulating layer 130. The first gate electrode 120 may fill a space defined by the first gate spacer 140. For example, the upper surface of the first gate electrode 120 may be placed on the same plane as the upper surface of the first gate spacer 140.

The first gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof.

A first source/drain region 150 may be formed on at least one side of the first gate structure 115. As an example, the first source/drain region 150 may be formed by implanting impurities into the substrate 100. As another example, the first source/drain region 150 may include an epitaxial pattern. The epitaxial pattern may fill recesses formed in the substrate 100.

Although not illustrated, the first source/drain region 150 may also include a metal silicide layer.

A first interlayer insulating layer 71 may be formed on the substrate 100. The first interlayer insulating layer 71 may cover the first source/drain region 150 and the first gate structure 115. Although the first interlayer insulating layer 71 is illustrated as a single layer, the present disclosure is not limited thereto. For example, the first interlayer insulating layer 71 may be a plurality of insulating layers formed in different processes with reference to an upper surface 140u of the first gate spacer.

A second interlayer insulating layer 72 and a third interlayer insulating layer 73 may be sequentially formed on the first interlayer insulating layer 71.

Each of the first interlayer insulating layer 71, the second interlayer insulating layer 72 and the third interlayer insulating layer 73 may include, but is not limited to, for example, silicon oxide, silicon nitride, silicon oxynitride, FOX (Flowable Oxide), TOSZ (Tonen SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped Silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material or combinations thereof.

A first conductive connection group 155 may be formed on the substrate 100. The first conductive connection group 155 may be connected to the first gate electrode 120.

The first conductive connection group 155 may include a first gate contact plug 165, a first lower via plug 176, a first lower interlayer wiring 177, a first upper via plug 186, and a first upper interlayer wiring 187. The first lower interlayer wiring 177 is formed at a metal level different from that of the first upper interlayer wiring 187. For example, the metal level of the first lower interlayer wiring 177 is lower than that of the first upper interlayer wiring 187.

The first gate contact plug 165 may be formed on the first gate structure 115. The first gate contact plug 165 may be connected to the first gate electrode 120. The first gate contact plug 165 may be in contact with the first gate electrode 120.

The first gate contact plug 165 may be formed in a first gate contact hole 165t inside the first interlayer insulating layer 71. The first gate contact hole 165t may expose the first gate electrode 120.

The first gate contact plug 165 may include a first gate contact barrier layer 165a, a first ferroelectric material layer 50 and a first gate contact filling layer 165b on the first gate electrode 120. An upper surface of the first gate contact plug 165 is higher than an upper surface of the first gate structure 115.

The first gate contact barrier layer 165a may extend along sidewalls and a bottom surface of the first gate contact hole 165t.

The first ferroelectric material layer 50 may be formed on the first gate contact barrier layer 165a. The first ferroelectric material layer 50 may extend along sidewalls and a bottom surface of the first gate contact hole 165t. At least a part of the first ferroelectric material layer 50 may be disposed above the upper surface 140u of the first gate spacer. In an example embodiment, an uppermost surface of the first ferroelectric material layer 50 is higher than the upper surface 140u of the first gate spacer.

The first gate contact filling layer 165b may be formed on the first ferroelectric material layer 50. The first gate contact filling layer 165b may fill the first gate contact hole 165t.

The first lower via plug 176 may be formed on the first gate contact plug 165. The first lower via plug 176 may be connected to the first gate contact plug 165. The first lower via plug 176 may be in contact with the first gate contact plug 165.

The first lower via plug 176 may be formed in a first lower via hole 176t inside the second interlayer insulating layer 72. The first lower via hole 176t may expose the first gate contact plug 165.

The first lower via plug 176 may include a first lower via barrier layer 176a and a first lower via filling layer 176b on the first gate contact plug 165.

The first lower via barrier layer 176a may be formed along sidewalls and a bottom surface of the first lower via hole 176t. The first lower via filling layer 176b may be formed on the first lower via barrier layer 176a. The first lower via filling layer 176b may fill the first lower via hole 176t.

The first lower interlayer wiring 177 may be formed on the first lower via plug 176. The first lower interlayer wiring 177 may be connected to the first lower via plug 176. The first lower interlayer wiring 177 may be in contact with the first lower via plug 176.

The first lower interlayer wiring 177 may be formed in a first lower wiring trench 177t inside the second interlayer insulating layer 72. The first lower via hole 176t may be formed on the bottom surface of the first lower wiring trench 177t. For example, the first lower via hole 176t may be connected to the bottom surface of the first lower wiring trench 177t.

The first lower interlayer wiring 177 may include a first lower wiring barrier layer 177a and a first lower wiring filling layer 177b on the first lower via plug 176.

The first lower wiring barrier layer 177a may be formed along sidewalls and a bottom surface of the first lower wiring trench 177t. The first lower wiring filling layer 177b may be formed on the first lower wiring barrier layer 177a. The first lower wiring filling layer 177b may fill the first lower wiring trench 177t.

The first lower wiring barrier layer 177a and the first lower via barrier layer 176a may be formed by the same fabricating process, and the first lower wiring filling layer 177b and the first lower via filling layer 176b may be formed by the same fabricating process. For example, the first lower interlayer wiring 177 and the first lower via plug 176 may be integrally formed using a dual-damascene process. As a result, the first lower via plug 176 and the first lower interlayer wiring 177 may achieve an integral structure.

The first upper via plug 186 may be formed on the first lower interlayer wiring 177. The first upper via plug 186 may be connected to the first lower interlayer wiring 177.

The first upper via plug 186 may be formed in a first upper via hole 186t inside the third interlayer insulating layer 73. The first upper via plug 186 may include a first upper via barrier layer 186*a* and a first upper via filling layer 186*b* on the first lower interlayer wiring 177.

The first upper via barrier layer 186*a* may be formed along sidewalls and a bottom surface of the first upper via hole 186*t*. The first upper via filling layer 186*b* may be formed on the first upper via barrier layer 186*a*. The first upper via filling layer 186*b* may fill the first upper via hole 186*t*.

The first upper interlayer wiring 187 may be formed on the first upper via plug 186. The first upper interlayer wiring 187 may be connected to the first upper via plug 186. The first upper interlayer wiring 187 may be contact with the first upper via plug 186.

The first upper interlayer wiring 187 may be formed in a first upper wiring trench 187*t* inside the third interlayer insulating layer 73. The first upper via hole 186*t* may be formed on the bottom surface of the first upper wiring trench 187*t*. For example, the first upper via hole 186*t* may be connected to the bottom surface of the first upper wiring trench 187*t*.

The first upper interlayer wiring 187 may include a first upper wiring barrier layer 187*a* and a first upper wiring filling layer 187*b* on the first upper via plug 186.

The first upper wiring barrier layer 187*a* may be formed along sidewalls and a bottom surface of the first upper wiring trench 187*t*. The first upper wiring filling layer 187*b* may be formed on the first upper wiring barrier layer 187*a*. The first upper wiring filling layer 187*b* may fill the first upper wiring trench 187*t*.

The first upper wiring barrier layer 187*a* and the first upper via barrier layer 186*a* may be formed by the same fabricating process, and the first upper wiring filling layer 187*b* and the first upper via filling layer 186*b* may be formed by the same fabricating process. For example, the first upper interlayer wiring 187 and the first upper via plug 186 may be integrally formed using a dual-damascene process. As a result, the first upper via plug 186 and the first upper interlayer wiring 187 may achieve an integrated structure.

Unlike the illustrated case, other via plugs and interlayer wirings may be further formed between the first upper via plug 186 and the first lower interlayer wiring 177.

The second conductive connection group 156 may be formed on the substrate 100. The second conductive connection group 156 may be connected to the first source/drain region 150.

The second conductive connection group 156 may include a first source/drain contact plug 160, a second lower via plug 171, a second lower interlayer wiring 172, a second upper via plug 181, and a second upper interlayer wiring 182. The second lower interlayer wiring 172 is formed at a metal level different from that of the second upper interlayer wiring 182. The first lower interlayer wiring 177 and the second lower interlayer wiring 172 may be formed at the same metal level, and the first upper interlayer wiring 187 and the second upper interlayer wiring 182 may be formed at the same metal level.

The first source/drain contact plug 160 may be formed on the first source/drain region 150. The first source/drain contact plug 160 may be connected to the first source/drain region 150. The first source/drain contact plug 160 may be in contact with the first source/drain region 150.

The first source/drain contact plug 160 may be formed in a first source/drain contact hole 160*t* inside the first interlayer insulating layer 71. The first source/drain contact hole 160*t* may expose the first source/drain region 150.

The first source/drain contact plug 160 may include a first source/drain contact barrier layer 160*a* and a first source/drain contact filling layer 160*b* on the first source/drain region 150.

The first source/drain contact barrier layer 160*a* may extend along sidewalls and a bottom surface of the first source/drain contact hole 160*t*. The first source/drain contact filling layer 160*b* may be formed on the first source/drain contact barrier layer 160*a*. The first source/drain contact filling layer 160*b* may fill the first source/drain contact hole 160*t*.

The upper surface of the first source/drain contact plug 160 is higher than the upper surface of the first gate structure 115. The upper surface of the first source/drain contact plug 160 may be placed on the same plane as the upper surface of the first gate contact plug 165.

In the semiconductor device according to some embodiments of the present disclosure, a height h11 from the upper surface of the first gate structure 115 to the uppermost surface of the first ferroelectric material layer 50 may be the same as or greater than a height h12 from the upper surface of the first gate structure 115 to the upper surface of the first source/drain contact plug 160. For example, the uppermost surface of the first ferroelectric material layer 50 may be positioned at the same as or higher than the upper surface of the first source/drain contact plug 160 in a vertical direction perpendicular to the upper surface of the substrate 100.

For example, the height h11 from the upper surface of the first gate structure 115 to the uppermost surface of the first ferroelectric material layer 50 may be substantially the same as the height h12 from the upper surface of the first gate structure 115 to the upper surface of the first source/drain contact plug 160.

The second lower via plug 171 may be formed on the first source/drain contact plug 160. The second lower via plug 171 may be connected to the first source/drain contact plug 160. The second lower via plug 171 may be in contact with the first source/drain contact plug 160.

The second lower via plug 171 may be formed in a second lower via hole 171*t* inside the second interlayer insulating layer 72. The second lower via hole 171*t* may expose the first source/drain contact plug 160.

The second lower via plug 171 may include a second lower via barrier layer 171*a* and a second lower via filling layer 171*b* on the first source/drain contact plug 160.

The second lower via barrier layer 171*a* may be formed along sidewalls and a bottom surface of the second lower via hole 171*t*. The second lower via filling layer 171*b* may be formed on the second lower via barrier layer 171*a*. The second lower via filling layer 171*b* may fill the second lower via hole 171*t*.

The second lower interlayer wiring 172 may be formed on the second lower via plug 171. The second lower interlayer wiring 172 may be connected to the second lower via plug 171. The second lower interlayer wiring 172 may be in contact with the second lower via plug 171.

The second lower interlayer wiring 172 may be formed in a second lower wiring trench 172*t* inside the second interlayer insulating layer 72. The second lower via hole 171*t* may be formed on the bottom surface of the second lower wiring trench 172*t*. For example, the second lower via hole 171*t* may be connected to the bottom surface of the second lower wiring trench 172*t*.

The second lower interlayer wiring 172 may include a second lower wiring barrier layer 172*a* and a second lower wiring filling layer 172*b* on the second lower via plug 171.

The second lower wiring barrier layer 172a may be formed along sidewalls and the bottom surface of the second lower wiring trench 172t. The second lower wiring filling layer 172b may be formed on the second lower wiring barrier layer 172a. The second lower wiring filling layer 172b may fill the second lower wiring trench 172t.

The second lower wiring barrier layer 172a and the second lower via barrier layer 171a may be formed by the same fabricating process, and the second lower wiring filling layer 172b and the second lower via filling layer 171b may be formed by the same fabricating process. For example, the second lower via plug 171 and the second lower interlayer wiring 172 may be integrally formed using a dual-damascene process. Therefore, the second lower via plug 171 and the second lower interlayer wiring 172 may achieve an integrated structure.

A second upper via plug 181 may be formed on the second lower interlayer wiring 172. The second upper via plug 181 may be connected to the second lower interlayer wiring 172.

The second upper via plug 181 may be formed in the second upper via hole 181t inside the third interlayer insulating layer 73. The second upper via plug 181 may include a second upper via barrier layer 181a and a second upper via filling layer 181b on the second lower interlayer wiring 172.

The second upper via barrier layer 181a may be formed along sidewalls and a bottom surface of the second upper via hole 181t. The second upper via filling layer 181b may be formed on the second upper via barrier layer 181a. The second upper via filling layer 181b may fill the second upper via hole 181t.

The second upper interlayer wiring 182 may be formed on the second upper via plug 181. The second upper interlayer wiring 182 may be connected to the second upper via plug 181. The second upper interlayer wiring 182 may be in contact with the second upper via plug 181.

The second upper interlayer wiring 182 may be formed in a second upper wiring trench 182t inside the third interlayer insulating layer 73. The second upper via hole 181t may be formed on the bottom surface of the second upper wiring trench 182t. For example, the second upper via hole 181t may be connected to the bottom surface of the second upper wiring trench 182t.

The second upper interlayer wiring 182 may include a second upper wiring barrier layer 182a and a second upper wiring filling layer 182b on the second upper via plug 181.

The second upper wiring barrier layer 182a may be formed along sidewalls and a bottom surface of the second upper wiring trench 182t. The second upper wiring filling layer 182b may be formed on the second upper wiring barrier layer 182a. The second upper wiring filling layer 182b may fill the second upper wiring trench 182t.

The second upper wiring barrier layer 182a and the second upper via barrier layer 181a may be formed by the same fabricating process, and the second upper wiring filling layer 182b and the second upper via filling layer 181b may be formed by the same fabricating process. For example, the second upper via plug 181 and the second upper interlayer wiring 182 may be integrally formed using a dual damascene process. Therefore, the second upper via plug 181 and the second upper interlayer wiring 182 may achieve an integrated structure.

The first ferroelectric material layer 50 may have ferroelectric characteristics. The first ferroelectric material layer 50 may have a thickness enough to have ferroelectric characteristics. For example, the first ferroelectric material layer 50 may have a thickness greater than a critical thickness at which the ferroelectric material layer 50 has ferroelectric characteristics. Since the critical thickness showing the ferroelectric characteristics may vary for a kind of a ferroelectric material of the first ferroelectric material layer 50, the thickness of the first ferroelectric material layer 50 may vary depending on the kind of the ferroelectric material.

The first ferroelectric material layer 50 may include, for example, at least one of hafnium oxide, hafnium zirconium oxide, zirconium oxide, barium strontium titanium oxide, barium titanium oxide, and lead zirconium titanium oxide. Here, hafnium zirconium oxide may be a material obtained by doping hafnium oxide with zirconium (Zr), and may be a compound of hafnium (Hf), zirconium (Zr) and oxygen (O).

The first ferroelectric material layer 50 may further include a doping element doped in the aforementioned material. The doping element may be an element selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr) and tin (Sn).

Each of the barrier layers 160a, 165a, 171a, 172a, 176a, 177a, 181a, 182a, 186a and 187a may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir) and rhodium (Rh).

Each of the filling layers 160b, 165b, 171b, 172b, 176b, 177b, 181b, 182b, 186b and 187b may include, for example, at least one of aluminum (Al), copper (Cu), tungsten (W) and cobalt (Co).

The first conductive connection group 155 connected to the first gate electrode 120 may include the first ferroelectric material layer 50. However, the second conductive connection group 156 connected to the first source/drain region 150 does not include a ferroelectric material layer.

A conductive layer is formed on the upper and lower parts of the first ferroelectric material layer 50 included in the first conductive connection group 155. That is, the first conductive connection group 155 may include a ferroelectric capacitor including the first ferroelectric material layer 50. In FIG. 1, by disposing the first ferroelectric material layer 50 between the first gate contact barrier layer 165a and the first gate contact filling layer 165b, a ferroelectric capacitor may be defined. For example, the layered structure of the first gate contact barrier layer 165a, the first ferroelectric material layer 50 and the first gate contact filling layer 165b may serve as a ferroelectric capacitor.

The ferroelectric capacitor may have a negative capacitance. The fact that the ferroelectric capacitor has a negative capacity means that the dipole moment of the molecule may be changed when the ferroelectric material receives an energy greater than a specific external energy. Unlike the ordinary dielectric capacitor, in the ferroelectric capacitor, a section having a negative energy may be generated at the phase transition of the material.

Therefore, when the ferroelectric material layer having the ferroelectric characteristics is used, a capacitor having a negative capacitance in a specific section may be implemented.

On the other hand, when the ferroelectric capacitor is connected in series with the gate electrode, the overall capacitance may increase. Therefore, the voltage applied to the gate electrode may be amplified.

As a result, voltage amplification may be implemented in the gate electrode of the transistor, and the switching speed of the transistor may be improved. That is, a transistor having a subthreshold swing (SS) less than 60 mV/decade at room temperature may be implemented.

Figure 2:
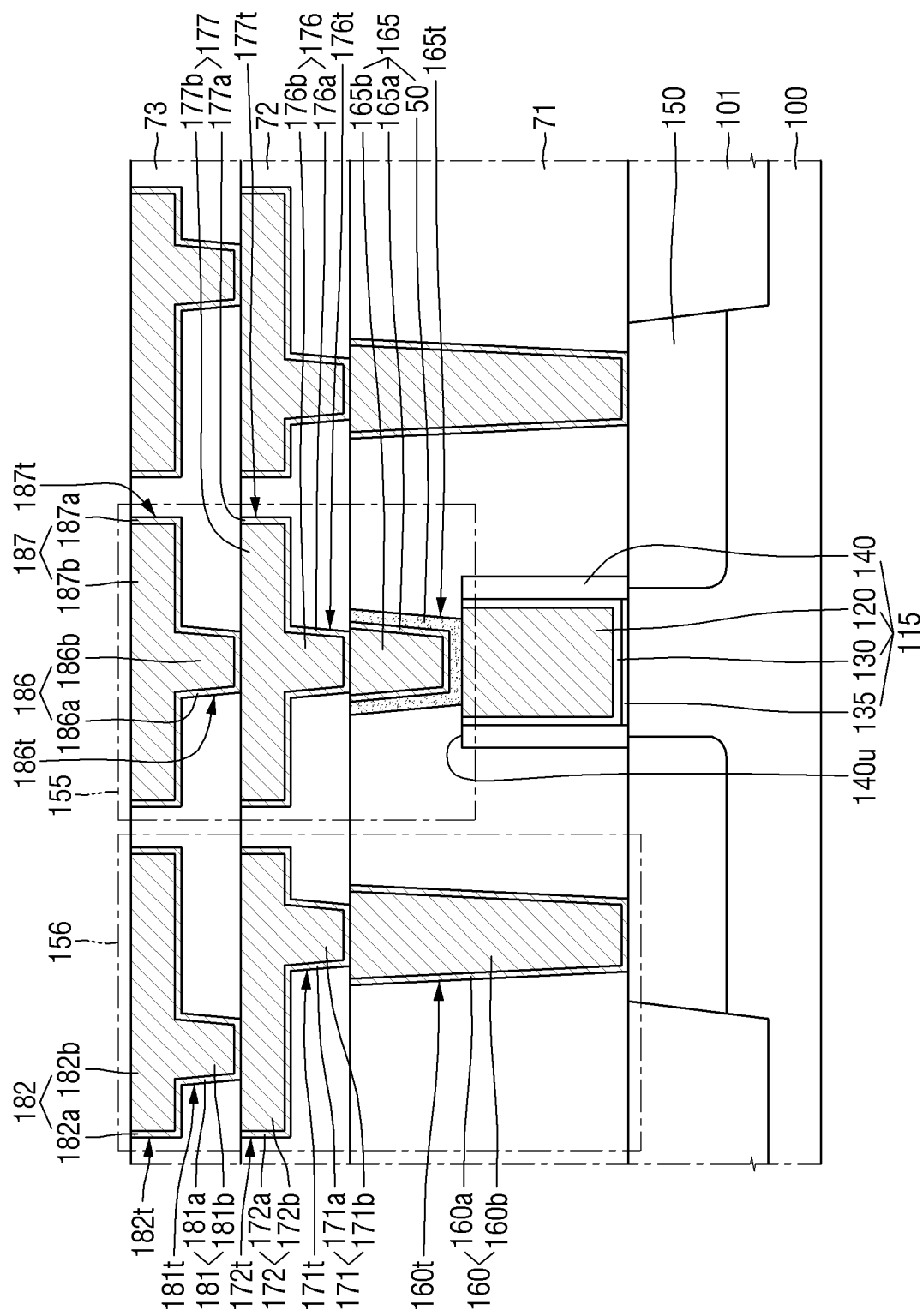
FIG. 2 is a diagram for explaining a semiconductor device according to some embodiments of the present disclosure.

FIG. 2 is a diagram illustrating a semiconductor device according to some embodiments of the present disclosure. For the sake of convenience of explanation, differences from those described using FIG. 1 will be mainly described.

Referring to FIG. 2, in the semiconductor device according to some embodiments of the present disclosure, the first gate contact plug 165 may include a first ferroelectric material layer 50, a first gate contact barrier layer 165a, and a first gate contact filling layer 165b sequentially stacked on the first gate electrode 120.

The first gate contact barrier layer 165a may be disposed between the first ferroelectric material layer 50 and the first gate contact filling layer 165b. For example, the first ferroelectric material layer 50 may be in contact with the first gate electrode 120.

The ferroelectric capacitor may be defined by disposing the first ferroelectric material layer 50 between the first gate contact barrier layer 165a and the first gate electrode 120.

Figure 3:
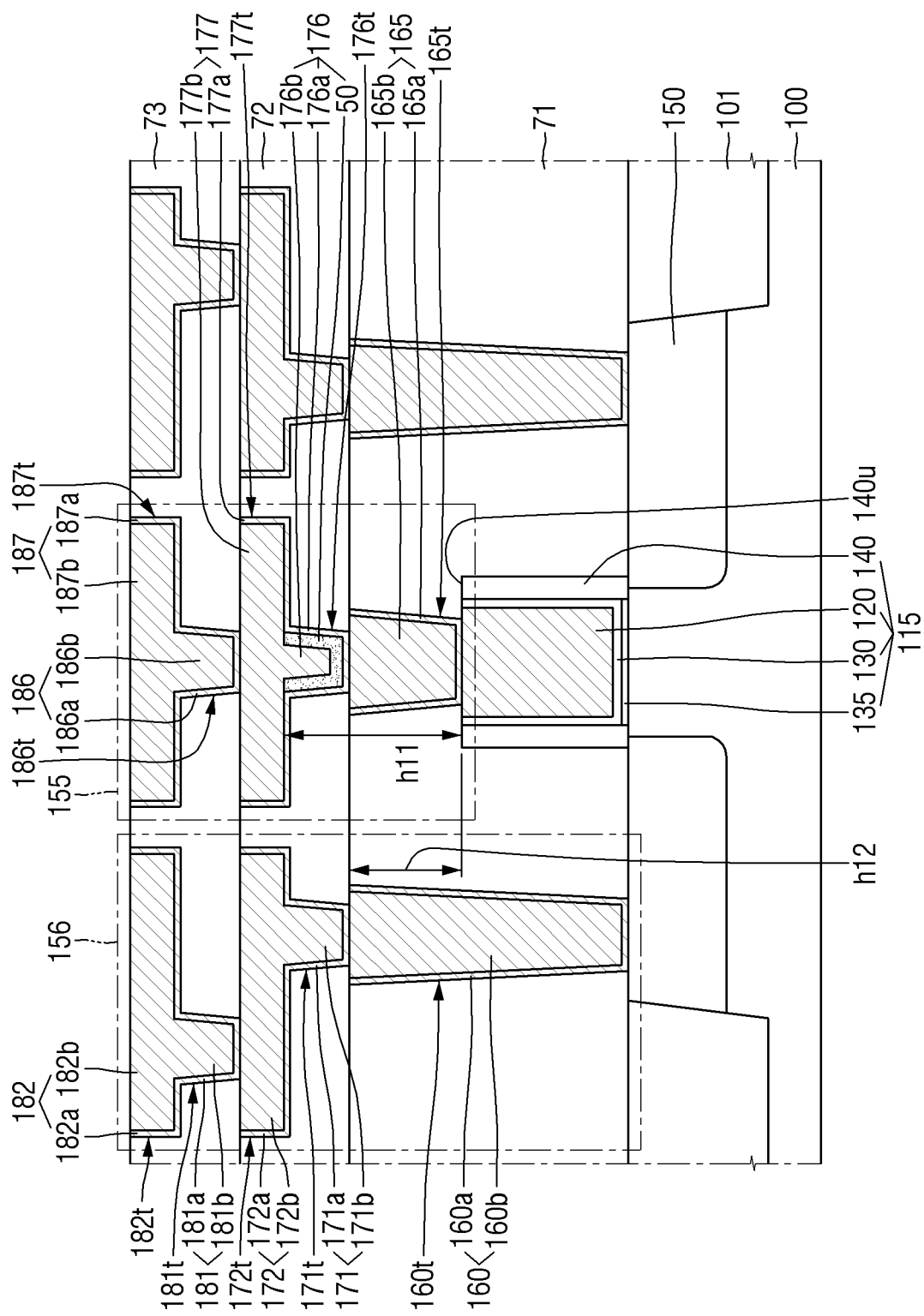
FIG. 3 is a diagram for explaining a semiconductor device according to some embodiments of the present disclosure.
Figure 4:
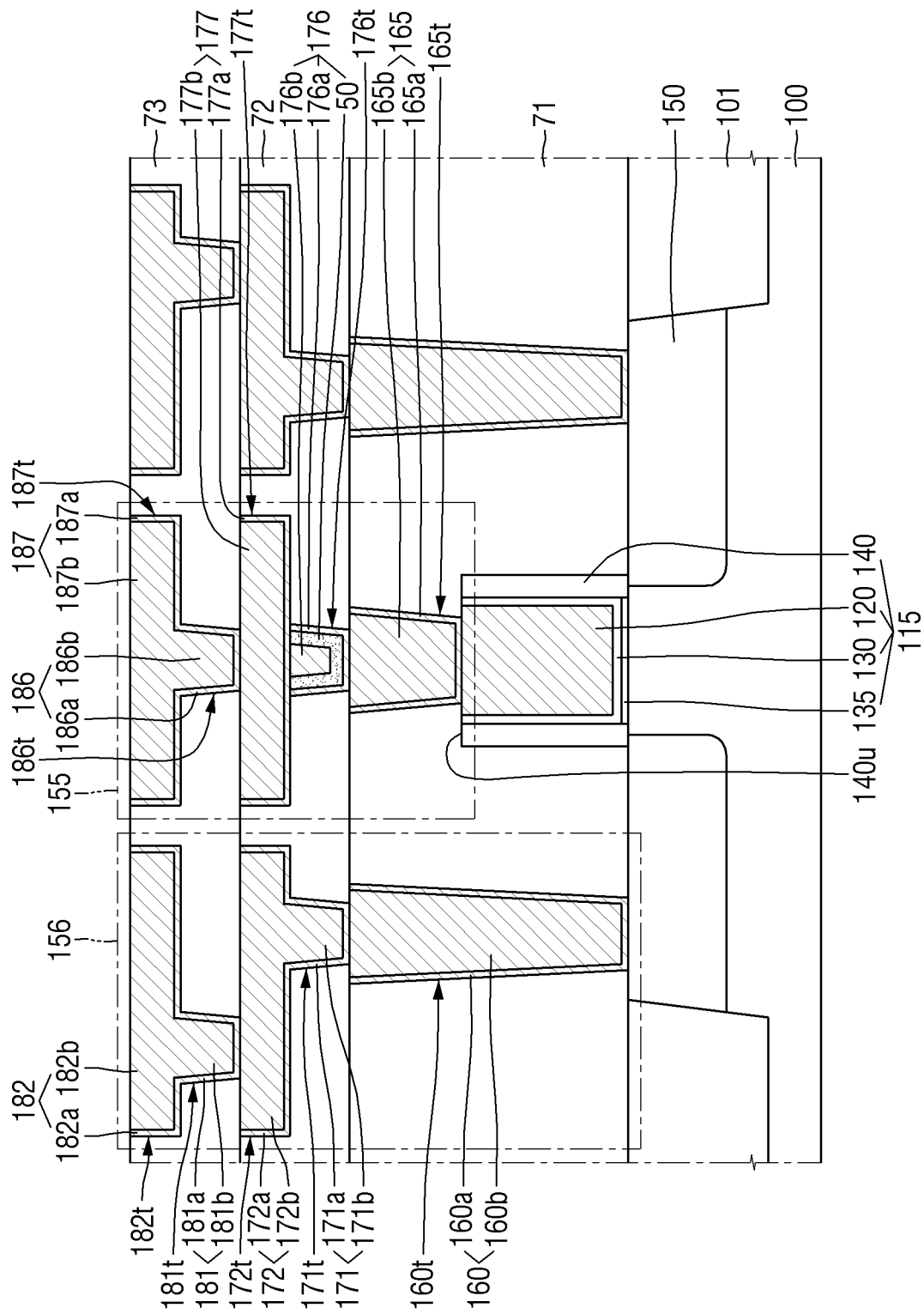
FIG. 4 is a diagram for explaining a semiconductor device according to some embodiments of the present disclosure.

FIG. 3 is a diagram illustrating the semiconductor device according to some embodiments of the present disclosure. FIG. 4 is a diagram illustrating the semiconductor device according to some embodiments of the present disclosure. For the sake of convenience of explanation, differences from those described using FIG. 1 will be mainly described.

Referring to FIGS. 3 and 4, in the semiconductor device according to some embodiments of the present disclosure, a first lower via plug 176 may include the first ferroelectric material layer 50.

The first lower via plug 176 may include a first lower via barrier layer 176a, the first ferroelectric material layer 50, and a first lower via filling layer 176b formed on the first gate contact plug 165.

The first ferroelectric material layer 50 may be disposed between the first lower via barrier layer 176a and the first lower via filling layer 176b. A ferroelectric capacitor may be defined by disposing the first ferroelectric material layer 50 between the first lower via barrier layer 176a and the first lower via filling layer 176b.

In an example embodiment, the first lower via barrier layer 176a may be disposed between the first ferroelectric material layer 50 and the first lower via filling layer 176b.

The first lower interlayer wiring 177 may not include the first ferroelectric material layer 50. The first ferroelectric material layer 50 may not extend along the lower surface of the first lower wiring filling layer 177b. That is, the first ferroelectric material layer 50 may not extend along the bottom surface of the first lower wiring trench 177t.

A height h11 from the upper surface of the first gate structure 115 to the uppermost surface of the first ferroelectric material layer 50 is larger than a height h12 from the upper surface of the first gate structure 115 to the upper surface of the first source/drain contact plug 160.

In FIG. 3, the first lower wiring filling layer 177b may be in contact with the first ferroelectric material layer 50. The first lower wiring filling layer 177b may be directly connected to the first lower via filling layer 176b.

In FIG. 4, the first lower wiring filling layer 177b may not be in contact with the first ferroelectric material layer 50. A first lower wiring barrier layer 177a may be disposed between the first lower wiring filling layer 177b and the first ferroelectric material layer 50. The first lower wiring filling layer 177b and the first lower via filling layer 176b may be separated from each other by the first lower wiring barrier layer 177a.

Figure 5:
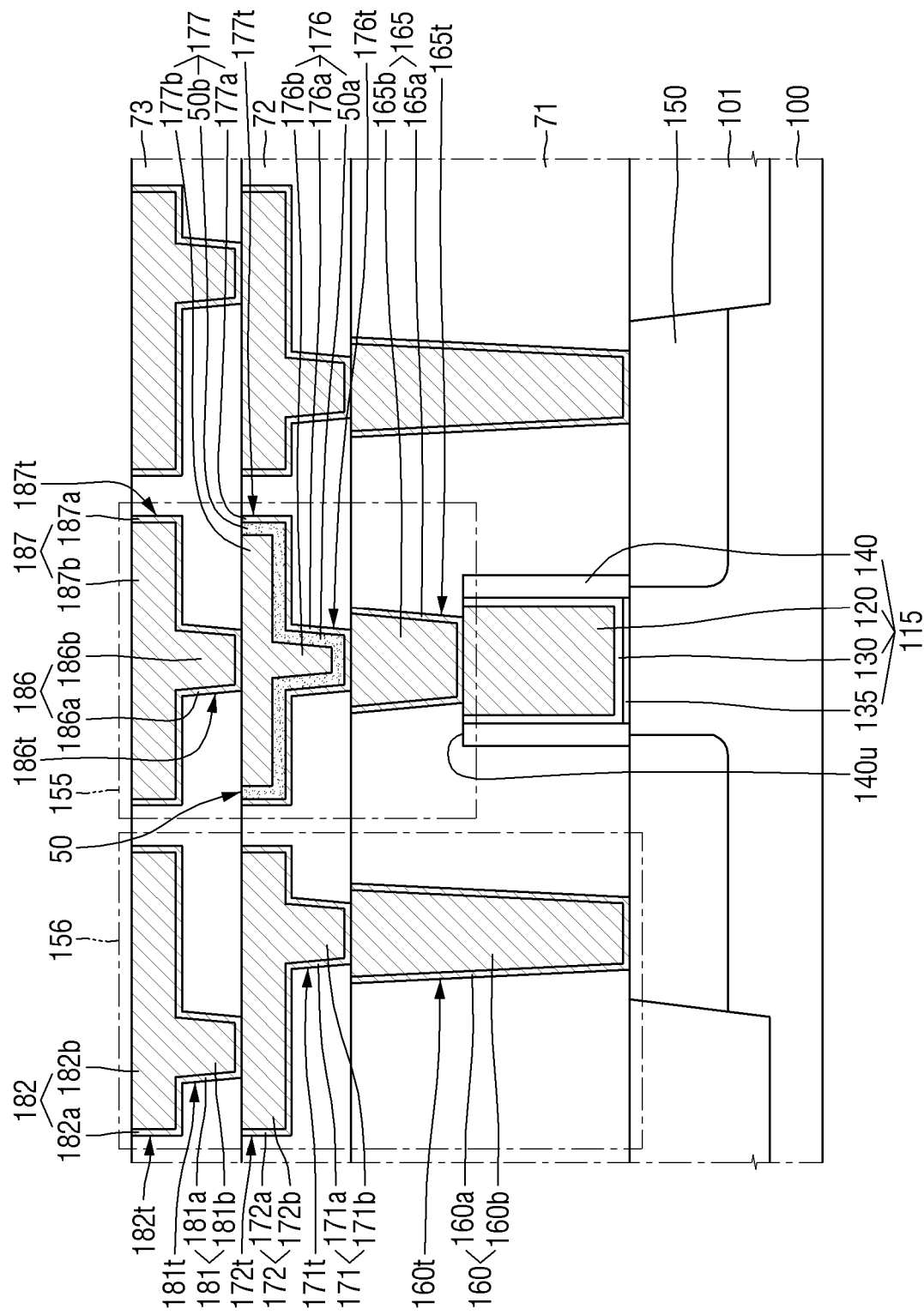
FIG. 5 is a diagram for explaining a semiconductor device according to some embodiments of the present disclosure.

FIG. 5 is a diagram for explaining the semiconductor device according to some embodiments of the present disclosure. For the sake of convenience of explanation, differences from those described using FIG. 1 will be mainly described.

Referring to FIG. 5, in the semiconductor device according to some embodiments of the present disclosure, a first lower via plug 176 and a first lower interlayer wiring 177 may include the first ferroelectric material layer 50.

The first ferroelectric material layer 50 may include a first portion 50a extending along sidewalls and the bottom surface of the first lower via hole 176t, and a second portion 50b extending along sidewalls and the bottom surface of the first lower wiring trench 177t.

The first lower via plug 176 may include a first lower via barrier layer 176a, a first portion 50a of the first ferroelectric material layer, and a first lower via filling layer 176b formed on the first gate contact plug 165.

The first lower interlayer wiring 177 may include a first lower wiring barrier layer 177a, a second portion 50b of the first ferroelectric material layer and a first lower wiring filling layer 177b formed on the first lower via plug 176.

The first ferroelectric material layer 50 may be disposed between the first lower barrier layers 176a and 177a and the first lower filling layers 176b and 177b. A ferroelectric capacitor may be defined by disposing the first ferroelectric material layer 50 between the first lower barrier layers 176a and 177a and the first lower filling layers 176b and 177b.

Figure 6:
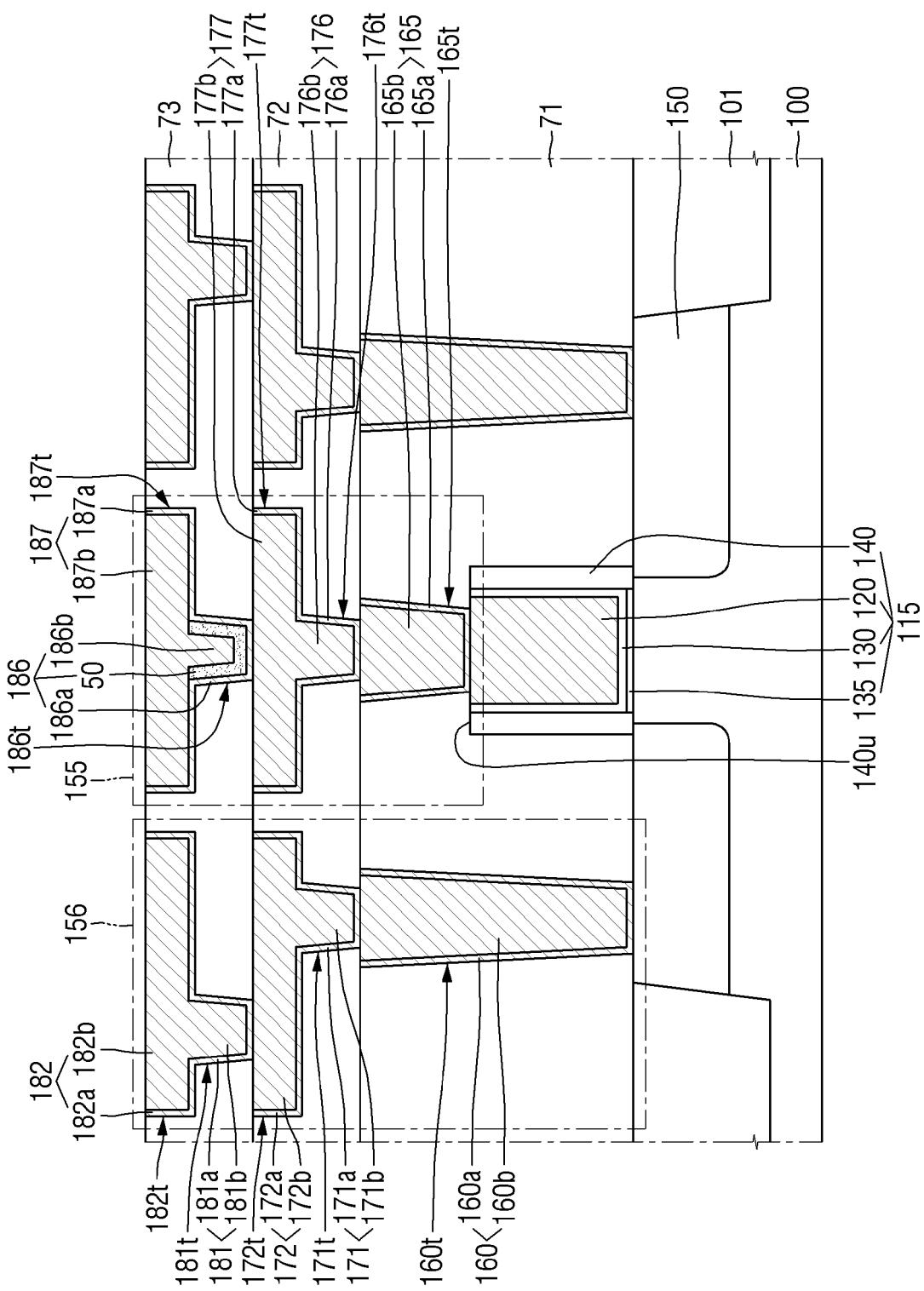
FIG. 6 is a diagram for explaining a semiconductor device according to some embodiments of the present disclosure.
Figure 7:
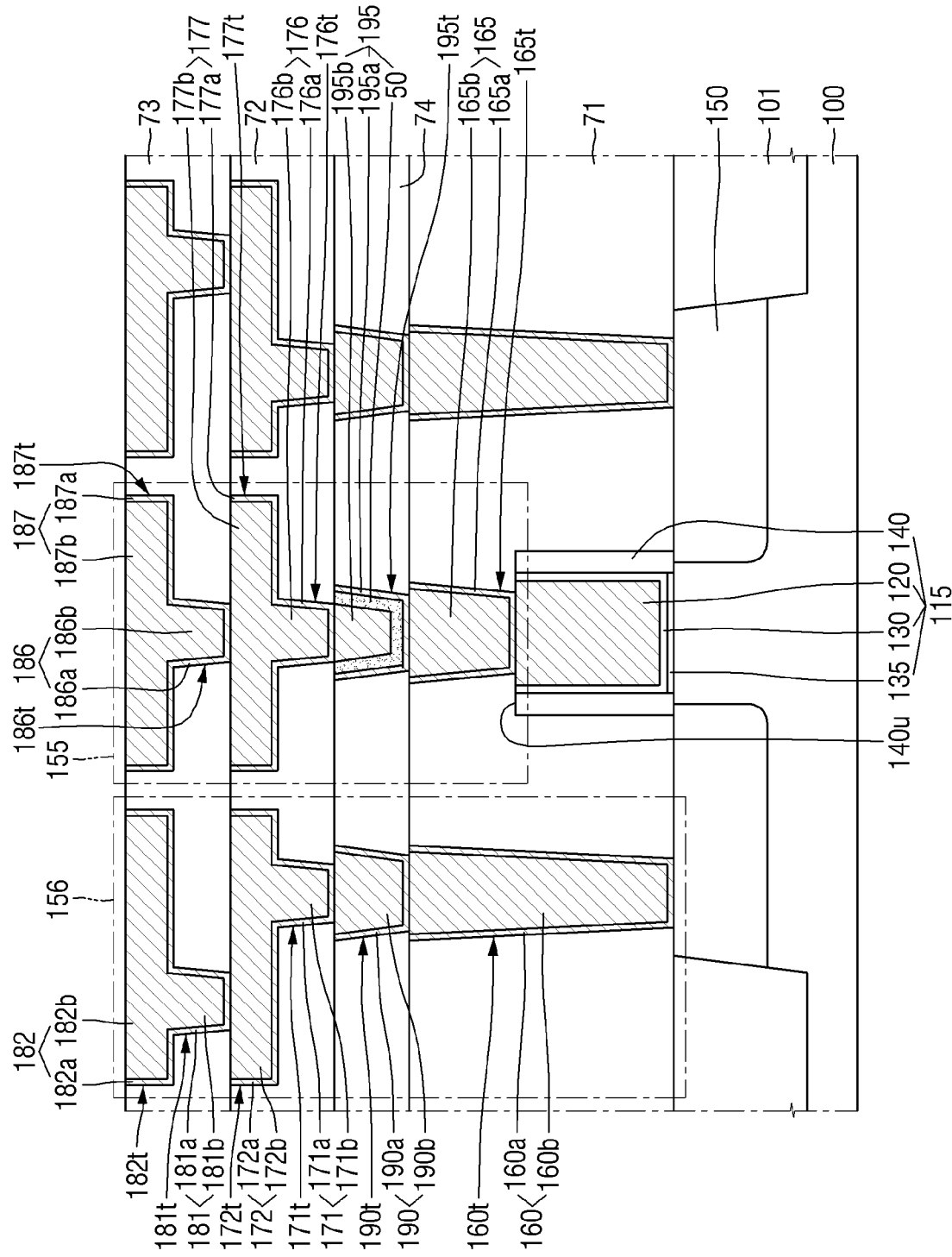
FIG. 7 is a cross-sectional view for explaining a semiconductor device according to some embodiments of the present disclosure.
Figure 8:
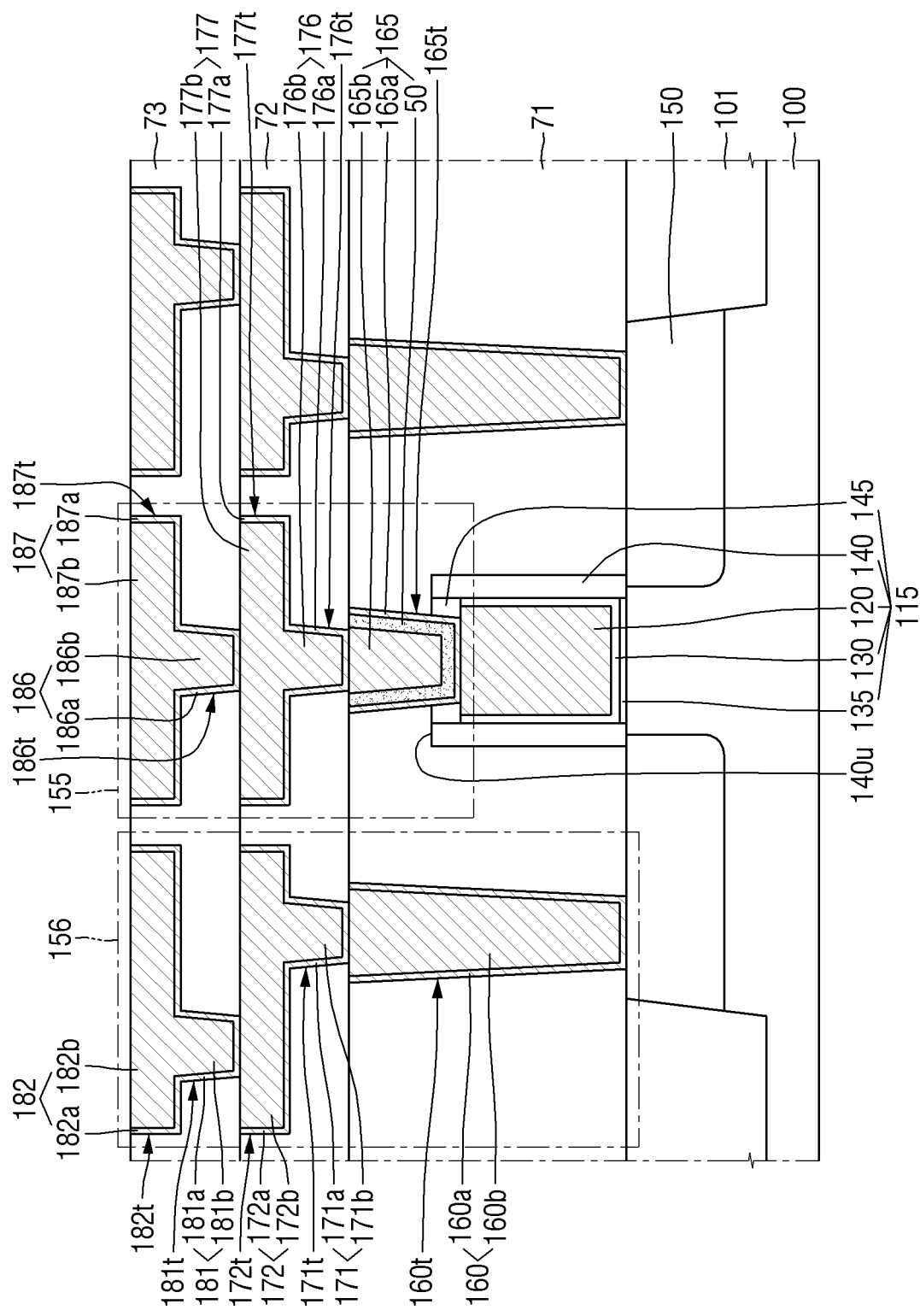
FIG. 8 is a diagram for explaining a semiconductor device according to some embodiments of the present disclosure.

FIG. 6 is a diagram for explaining the semiconductor device according to some embodiments of the present disclosure. FIG. 7 is a diagram for explaining the semiconductor device according to some embodiments of the present disclosure. FIG. 8 is a diagram for explaining the semiconductor device according to some embodiments of the present disclosure. For the sake of convenience of explanation, differences from those described using FIG. 1 will be mainly described.

Referring to FIG. 6, in the semiconductor device according to some embodiments of the present disclosure, the first upper via plug 186 may include the first ferroelectric material layer 50.

The first upper via plug 186 may include a first upper via barrier layer 186a, the first ferroelectric material layer 50 and a first upper via filling layer 186b formed on the first lower interlayer wiring 177.

The first ferroelectric material layer 50 may be disposed between the first upper via barrier layer 186a and the first upper via filling layer 186b. A ferroelectric capacitor may be defined by disposing the first ferroelectric material layer 50 between the first upper via barrier layer 186a and the first upper via filling layer 186b.

Unlike the illustrated case, the first upper via barrier layer 186a may, of course, be disposed between the first ferroelectric material layer 50 and the first upper via filling layer 186b. The first ferroelectric material layer 50 may be in contact with the first lower wiring filling layer 177b.

Although it is illustrated that the first upper interlayer wiring 187 does not include the first ferroelectric material layer 50, the present disclosure is not limited thereto. For example, the first upper interlayer wiring 187 may include the first ferroelectric material layer 50.

Referring to FIG. 7, the semiconductor device according to some embodiments of the present disclosure may further include a first insertion wiring 195 and a second insertion wiring 190. The first insertion wiring 195 may include the first ferroelectric material layer 50.

The first conductive connection group 155 may include a first insertion wiring 195. The first insertion wiring 195 may be disposed between the first gate contact plug 165 and the first lower via plug 176.

The first insertion wiring 195 may be formed on the first gate contact plug 165. The first insertion wiring 195 may be connected to the first gate contact plug 165. The first insertion wiring 195 may be in contact with the first gate contact plug 165.

The first insertion wiring 195 may be formed in a first insertion wiring trench 195t inside the insertion interlayer insulating layer 74. The first insertion wiring trench 195t may expose the first gate contact plug 165.

The first insertion wiring 195 may include a first insertion wiring barrier layer 195a on the first gate contact plug 165, the first ferroelectric material layer 50, and a first insertion wiring filling layer 195b. The first insertion wiring barrier layer 195a and the first ferroelectric material layer 50 may extend along the sidewalls and the bottom surface of the first insertion wiring trench 195t. The first insertion wiring filling layer 195b may be formed on the first ferroelectric material layer 50.

As illustrated, a ferroelectric capacitor may be defined by disposing the first ferroelectric material layer 50 between the first insertion wiring barrier layer 195a and the first insertion wiring filling layer 195b.

On the other hand, unlike the illustrated case above, in a case where the first insertion wiring barrier layer 195a is disposed between the first ferroelectric material layer 50 and the first insertion wiring filling layer 195b, the first ferroelectric material layer 50 is disposed between the first insertion wiring barrier layer 195a and the first gate contact plug 165, thereby defining the ferroelectric capacitor.

The second conductive connection group 156 may include a second insertion wiring 190. The second insertion wiring 190 may be disposed between the first source/drain contact plug 160 and the second lower via plug 171.

The second insertion wiring 190 may be formed on the first source/drain contact plug 160. The second insertion wiring 190 may be connected to the first source/drain contact plug 160. The second insertion wiring 190 may be in contact with the first source/drain contact plug 160.

The second insertion wiring 190 may be formed in a second insertion wiring trench 190t inside the insertion interlayer insulating layer 74. The second insertion wiring trench 190t may expose the first source/drain contact plug 160.

The second insertion wiring 190 may include a second insertion wiring barrier layer 190a and a second insertion wiring filling layer 190b on the first source/drain contact plug 160.

Referring to FIG. 8, in the semiconductor device according to some embodiments of the present disclosure, the first gate structure 115 may further include a first capping pattern 145 on the first gate electrode 120.

The upper surface of the first capping pattern 145 may be placed on the same plane as the upper surface 140u of the first gate spacer.

A first gate contact hole 165t may pass through the first capping pattern 145 to expose the first gate electrode 120.

Figure 9:
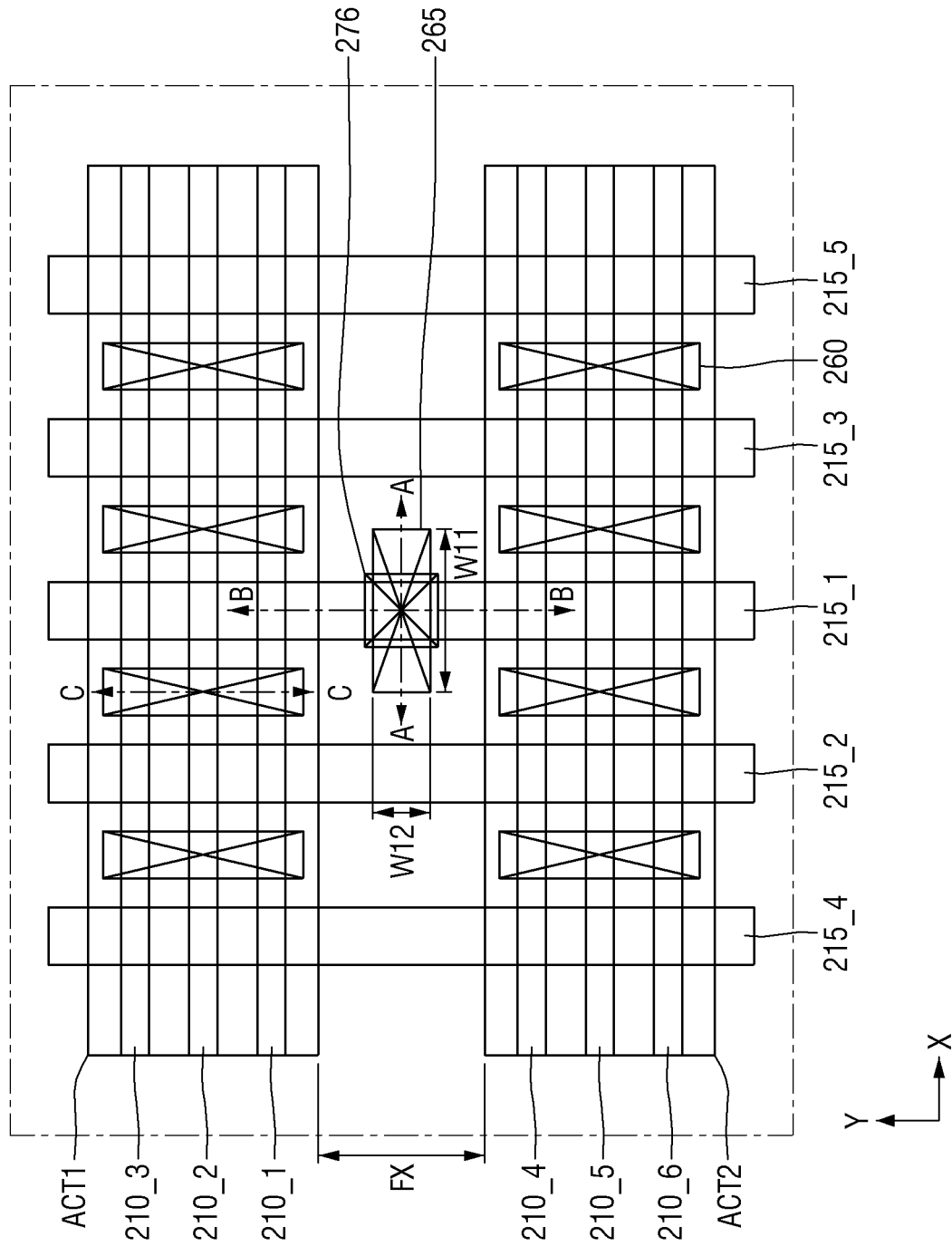
FIG. 9 is a layout diagram for explaining a semiconductor device according to some embodiments of the present disclosure.
Figure 10:
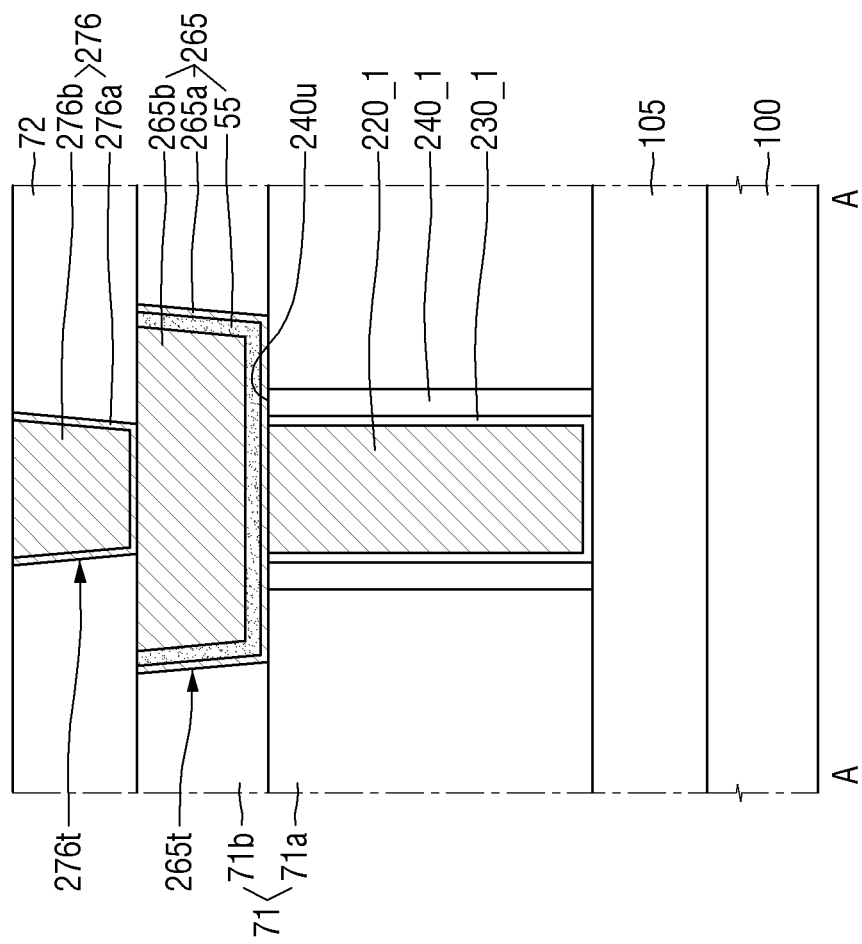
FIGS. 10 to 12 are cross-sectional views taken along lines A-A, B-B and C-C of FIG. 9.
Figure 11:
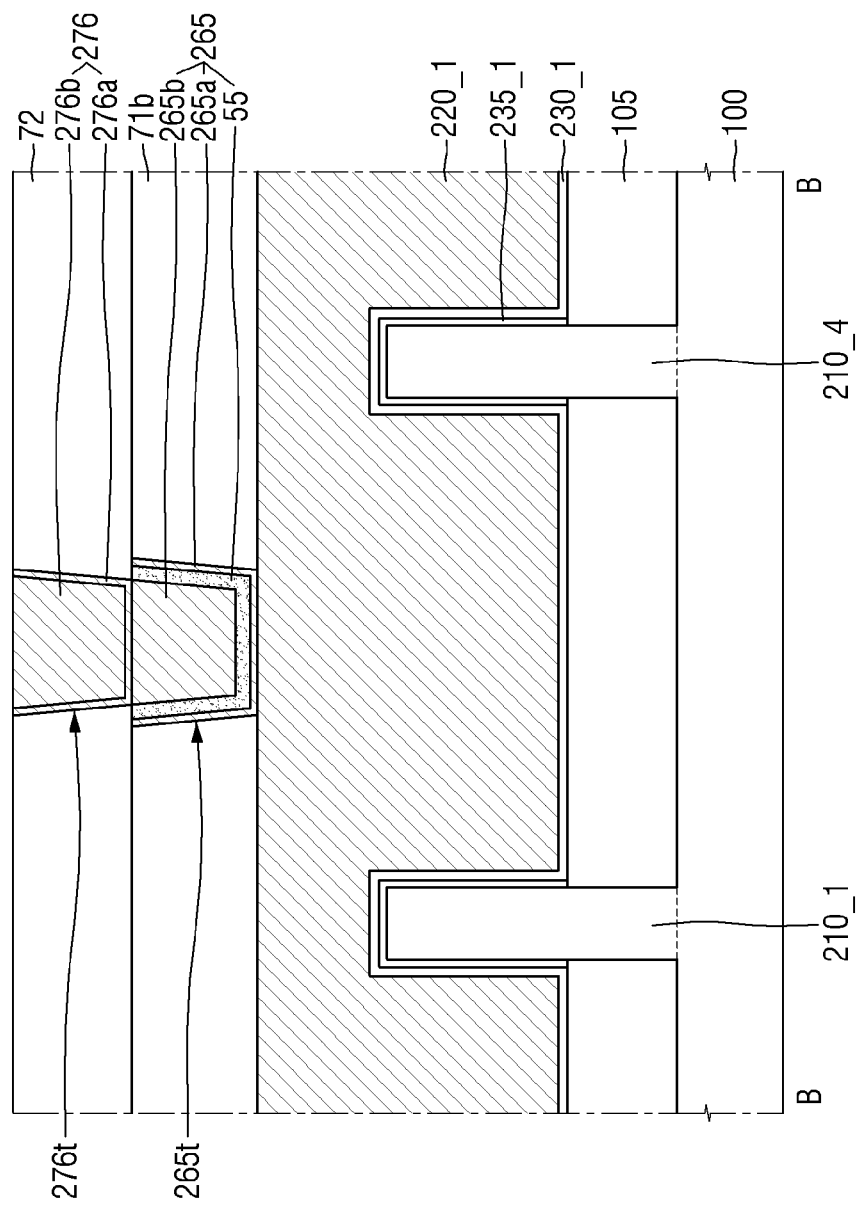
Figure 12:
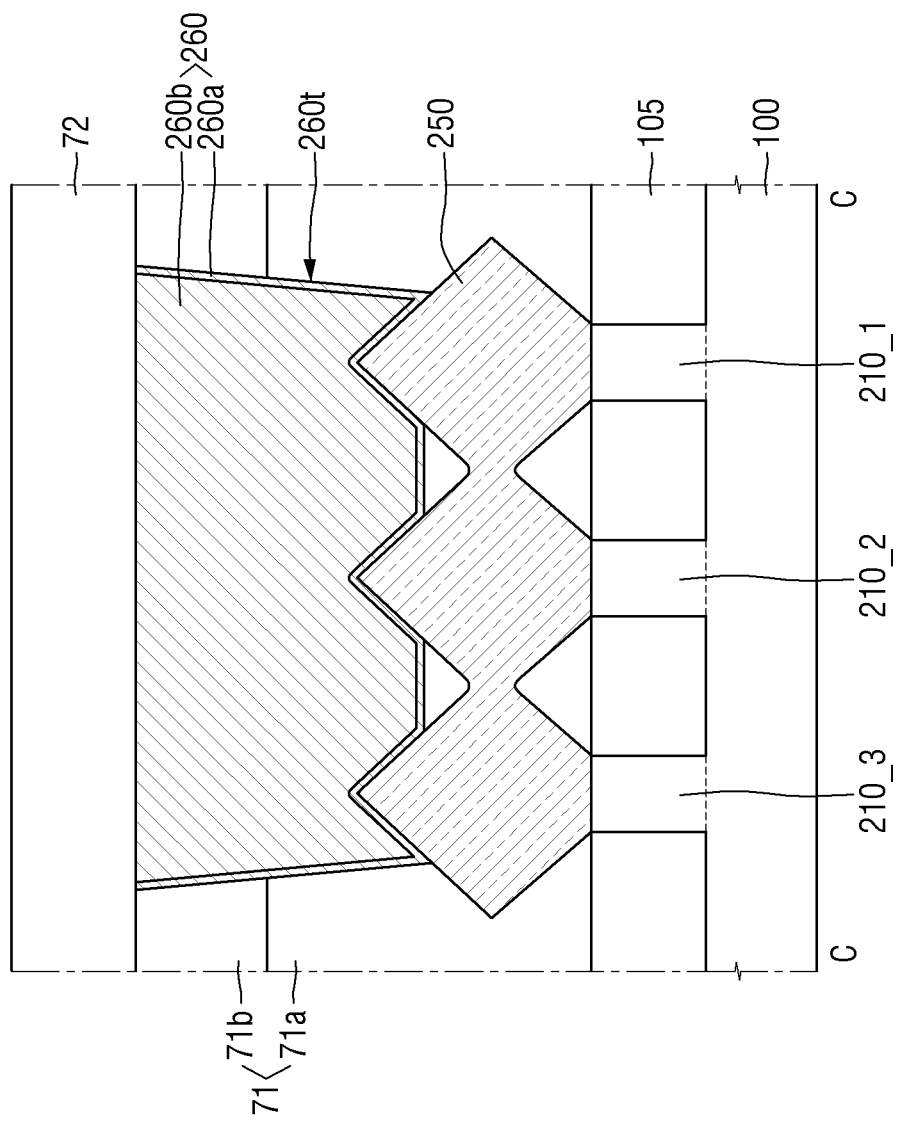

FIG. 9 is a layout diagram for explaining a semiconductor device according to some embodiments of the present disclosure. FIGS. 10 to 12 are cross-sectional views taken along lines A-A, B-B and C-C of FIG. 9. FIGS. 13a to 13e are diagrams for explaining example shapes that an upper surface of a second gate contact plug may have.

For the sake of convenience of explanation, without description of the interlayer wiring, the following examples will be described, using only the second gate contact plug 265 and a via plug 276 among the conductive connection group connected to a second gate structure 215_1. Further, explanation will be provided, using only a second source/drain contact plug 260 among the conductive connection group connected to a second source/drain region 250.

Further, although FIG. 9 illustrates that one second gate contact plug 265 is formed, it is only for convenience of explanation, and the embodiment is not limited thereto.

Referring to FIGS. 9 to 12, the semiconductor device according to some embodiments of the present disclosure may include fin type patterns 210_1, 210_2, 210_3, 210_4, 210_5 and 210_6, second gate structures 215_1, 215_2, 215_3, 215_4 and 215_5, the second gate contact plug 265, and the second source/drain contact plug 260.

A substrate 100 may include a first active region ACT1 and a second active region ACT2 adjacent to each other, and a field region FX. The field region FX may serve to electrically isolate the first active region ACT1 and the second active region ACT2 from each other. Although the field region FX is illustrated as being defined only between the first active region ACT1 and the second active region ACT2, this is for convenience of explanation, and the embodiment is not limited thereto. For example, the field region FX may surround each of the first active region ACT1 and the second active region ACT2.

The plurality of fin type patterns 210_1, 201_2 and 210_3 may be formed on the substrate 100 of the first active region ACT1. Further, the plurality of fin type patterns 210_4, 201_5 and 210_6 may be formed on the substrate 100 of the second active region ACT2.

The fin type patterns 210_1, 210_2, 210_3, 210_4, 210_5 and 210_6 may each extend long in a first direction X.

It is illustrated that the same number of fin type patterns are formed in the first active region ACT1 and the second active region ACT2, but the present disclosure is not limited thereto.

The fin type patterns 210_1, 210_2, 210_3, 210_4, 210_5 and 210_6 may be a part of the substrate 100. For example, the fin type patterns 210_1, 210_2, 210_3, 210_4, 210_5 and 210_6 may be epitaxially grown from the substrate 100 or may be formed by patterning the substrate 100. The fin type patterns 210_1, 210_2, 210_3, 210_4, 210_5 and 210_6 may include silicon or germanium which is an element semiconductor material, respectively.

Further, the fin type patterns 210_1, 210_2, 210_3, 210_4, 210_5 and 210_6 may include a compound semiconductor, and may include, for example, a group IV-IV compound semiconductor or a group III-V compound semiconductor. The group IV-IV compound semiconductor may be, for example, a binary compound including at least two or more of carbon (C), silicon (Si), germanium (Ge) and tin (Sn), a ternary compound, or a compound obtained by doping these elements with a group IV element. For example, the group III-V compound semiconductor may be, for example, a binary compound, a ternary compound or a quaternary compound formed by combination of at least one of aluminum (Al), gallium (Ga) and indium (In) as a group III element with one of phosphorus (P), arsenic (As) and antimony (Sb) as a group V element.

A field insulating layer 105 may be formed on the substrate 100. The field insulating layer 105 may define fin type patterns 210_1, 210_2, 210_3, 210_4, 210_5 and 210_6. The field insulating layer 105 may be disposed on a part of the sidewalls of the fin type patterns 210_1, 210_2, 210_3, 210_4, 210_5 and 210_6.

The field insulating layer 105 may include, for example, at least one of a silicon oxide layer, a silicon nitride layer, and a silicon oxynitride layer.

The second gate structures 215_1, 215_2, 215_3, 215_4 and 215_5 may be formed on the substrate 100. The second gate structures 215_1, 215_2, 215_3, 215_4 and 215_5 may extend long in a second direction Y.

The second gate structures 215_1, 215_2, 215_3, 215_4 and 215_5 may be formed over the first active region ACT1, the field region FX and the second active region ACT2. The second gate structures 215_1, 215_2, 215_3, 215_4 and 215_5 may be formed on the fin type patterns 210_1, 210_2, 210_3, 210_4, 210_5 and 210_6. The second gate structures 215_1, 215_2, 215_3, 215_4 and 215_5 may intersect fin type patterns 210_1, 210_2, 210_3, 210_4, 210_5 and 210_6.

The second gate structure 215_1 may include a second interfacial layer 235_1, a second gate insulating layer 230_1, and a second gate electrode 220_1. The second gate structure 215_1 may include a second gate spacer 240_1 formed on the sidewalls of the second gate electrode 220_1.

The second interfacial layer 235_1 may be formed along the profile of the fin type patterns 210_1 and 210_4 protruding above the upper surface of the field insulating layer 105. The second gate insulating layer 230_1 may be formed along a profile of fin type patterns 210_1 and 210_4 protruding above the upper surface of the field insulating layer 105. The second gate electrode 220_1 may be formed on the second gate insulating layer 230_1.

The second source/drain region 250 may be formed on the fin type patterns 210_1, 210_2 and 210_3 disposed in the first active region ACT1. A source/drain region may, of course, be formed on the fin type patterns 210_4, 210_5 and 210_6 disposed in the second active region ACT2. Although the second source/drain region 250 is illustrated as having a shape coupled to each other, the embodiment is not limited thereto.

A first interlayer insulating layer 71 may include a first lower interlayer insulating layer 71a and a first upper interlayer insulating layer 71b. The first lower interlayer insulating layer 71a and the first upper interlayer insulating layer 71b may be divided with reference to an upper surface 240u of the second gate spacer.

The second gate contact plug 265 may be formed on the second gate electrode 220_1. The second gate contact plug 265 may be connected to the second gate electrode 220_1. The second gate contact plug 265 may be in contact with the second gate electrode 220_1.

The second gate contact plug 265 may be formed in a second gate contact hole 265t inside the first upper interlayer insulating layer 71b. The second gate contact hole 265t may expose a part of the second gate electrode 220_1.

The second gate contact plug 265 may include a second gate contact barrier layer 265a, a second ferroelectric material layer 55, and a second gate contact filling layer 265b on the second gate electrode 220_1. The upper surface of the second gate contact plug 265 is higher than the upper surface of the second gate structure 215_1.

The second gate contact barrier layer 265a may extend along sidewalls and a bottom surface of the second gate contact hole 265t.

The second ferroelectric material layer 55 may be formed on the second gate contact barrier layer 265a. The second ferroelectric material layer 55 may extend along sidewalls and the bottom surface of the second gate contact hole 265t. At least a part of the second ferroelectric material layer 55 may be disposed above the upper surface 240u of the second gate spacer. In other ways, the uppermost surface of the second ferroelectric material layer 55 is higher than the upper surface 240u of the second gate spacer.

The second gate contact filling layer 265b may be formed on the second ferroelectric material layer 55. The second gate contact filling layer 265b may fill the second gate contact hole 265t.

Unlike the illustrated case, the second gate contact barrier layer 265a may be disposed between the second ferroelectric material layer 55 and the second gate contact filling layer 265b.

Since the second gate contact hole 265t exposes a part of the second gate electrode 220_1, a width W12 of the second gate contact plug 265 in the second direction Y is smaller than the width of the second gate electrode 220_1 in the second direction Y.

The second gate contact plug 265 may extend long in the first direction X. For example, the width W11 of the second gate contact plug 265 in the first direction X may be greater than a width W12 of the second gate contact plug 265 in the second direction Y.

Further, the width W11 of the second gate contact plug 265 in the first direction X may be greater than not only the width of the second gate electrode 220_1 in the first direction X, but also the width of the second gate structure 215_1 in the first direction X.

The second gate contact plug 265 may be disposed on the substrate 100 of the field region FX between the first active region ACT1 and the second active region ACT2. The second gate contact plug 265 may be in contact with the second gate electrode 220_1 disposed on the substrate 100 of the field region FX.

Unlike the illustrated case, the second gate contact plug 265 may be disposed on the substrate 100 rather than the first and second active regions ACT1 and ACT2, while a distal end of the second gate structure 215_1 is located thereon.

A via plug 276 may be formed on the second gate contact plug 265. The via plug 276 may be connected to the second gate contact plug 265. The via plug 276 may be in contact with the second gate contact plug 265.

The via plug 276 may be formed in a via hole 276t inside the second interlayer insulating layer 72. The via hole 276t may expose the second gate contact plug 265.

The via plug 276 may include a via barrier layer 276a and a via filling layer 276b on the second gate contact plug 265.

The via barrier layer 276a may be formed along the sidewalls and the bottom surface of the via hole 276t. The via filling layer 276b may be formed on the via barrier layer 276a. The via filling layer 276b may fill the via hole 276t.

The second source/drain contact plug 260 may be formed on the fin type patterns 210_1, 210_2, 210_3, 210_4, 210_5 and 210_6 between the adjacent second gate structures 215_1, 215_2, 215_3, 215_4 and 215_5.

The second source/drain contact plug 260 may be formed on the second source/drain region 250. The second source/drain contact plug 260 may be connected to the second source/drain region 250. The second source/drain contact plug 260 may be in contact with the second source/drain region 250.

The second source/drain contact plug 260 may be formed in a second source/drain contact hole 260t inside the first interlayer insulating layer 71. The second source/drain contact hole 260t may expose the second source/drain region 250.

The second source/drain contact plug 260 may include a second source/drain contact barrier layer 260a and a second source/drain contact filling layer 260b on the second source/drain region 250.

The second source/drain contact barrier layer 260a may extend along the sidewalls and the bottom surface of the second source/drain contact hole 260t. The second source/drain contact filling layer 260b may be formed on the second source/drain contact barrier layer 260a. The second source/drain contact filling layer 260b may fill the second source/drain contact hole 260t.

The upper surface of the second source/drain contact plug 260 may be higher than the upper surface of the second gate structure 215_1. The upper surface of the second source/drain contact plug 260 may be placed on the same plane as the upper surface of the second gate contact plug 265.

A shape of an upper surface 265u of the second source/drain contact plug will be described, using FIGS. 13a through 13e.

Figure 13E:
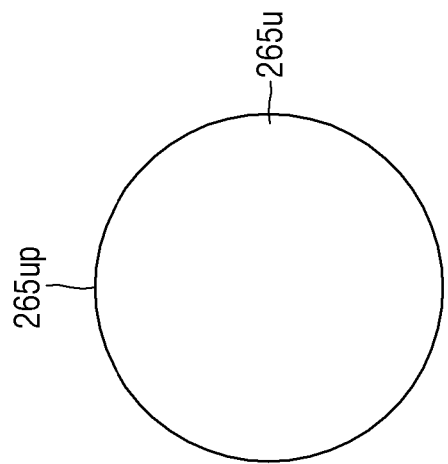

FIGS. 13a through 13c illustrate a case where the second gate contact plug (265 of FIG. 9) extends long in a certain direction. FIGS. 13d and 13e illustrate a case where the second gate contact plug 265 does not extend long in a specific direction.

In FIG. 13a, a boundary 265up of the upper surface of the second gate contact plug may have a rectangular shape.

In FIG. 13b, the boundary 265up of the upper surface of the second gate contact plug may have a rectangular shape with a rounded corner.

In FIG. 13c, the boundary 265up of the upper surface of the second gate contact plug may have an elliptical shape.

In FIG. 13d, the boundary 265up of the upper surface of the second gate contact plug may have a square shape.

In FIG. 13e, the boundary 265up of the upper surface of the second gate contact plug may have a circular shape.

Unlike the shapes illustrated in FIGS. 13d and 13e, the boundary 265up of the upper surface of the second gate contact plug may also be a square shape with rounded corners.

Figure 15:
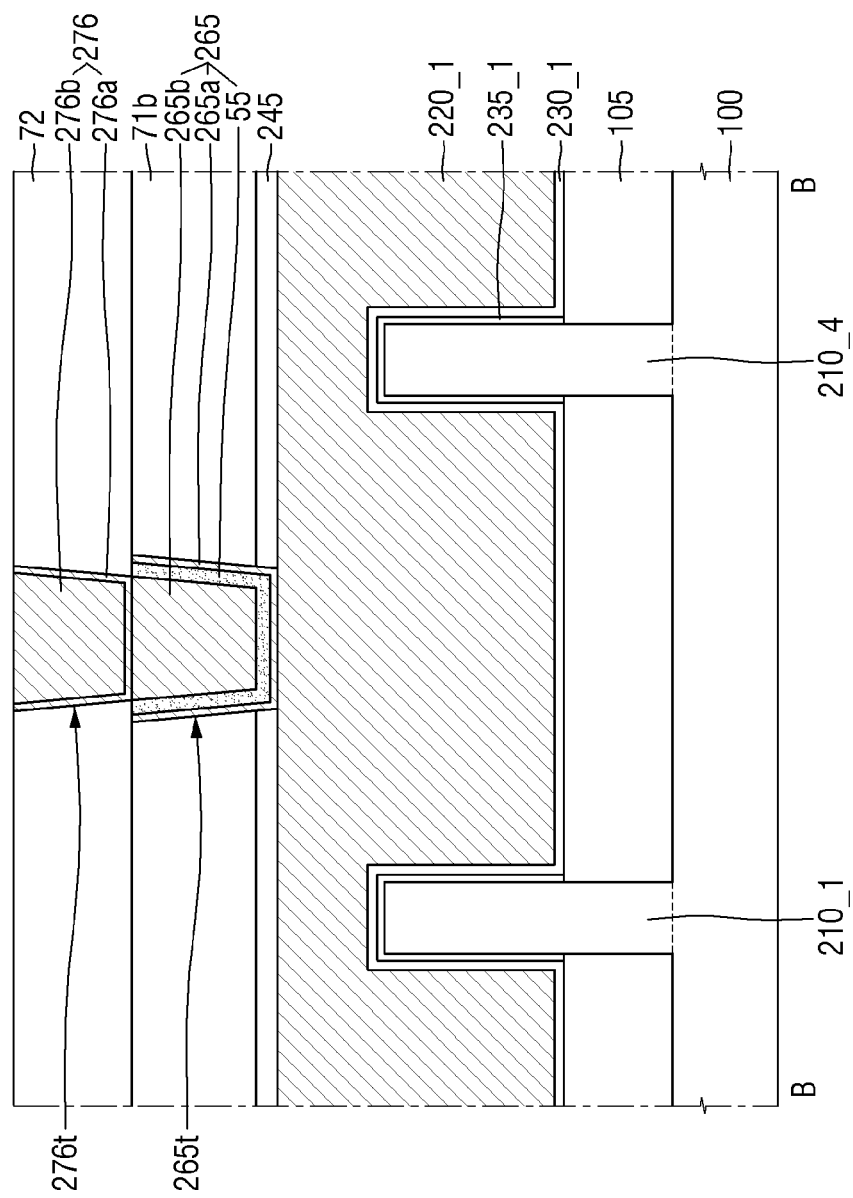

FIGS. 14 and 15 are diagrams for explaining the semiconductor device according to some embodiments of the present disclosure. For the sake of convenience of explanation, differences from those described using FIGS. 9 to 12 will be mainly described.

Referring to FIGS. 14 and 15, in the semiconductor device according to some embodiments of the present disclosure, the second gate structure 215_1 may further include a second capping pattern 245 on the second gate electrode 220_1.

The second gate contact hole 265t may penetrate a part of the second capping pattern 245 to expose a part of the second gate electrode 220_1.

Figure 16:
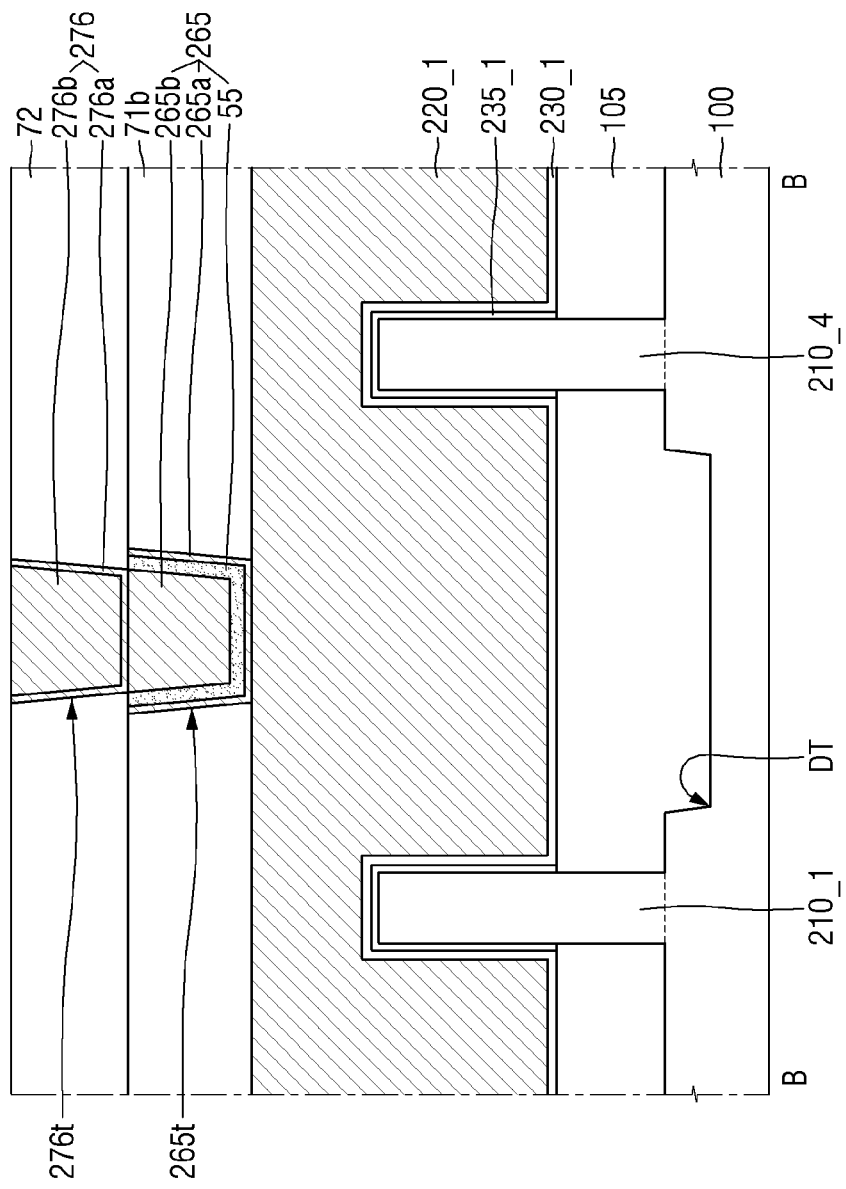
FIG. 16 is a diagram for explaining a semiconductor device according to some embodiments of the present disclosure.
Figure 17:
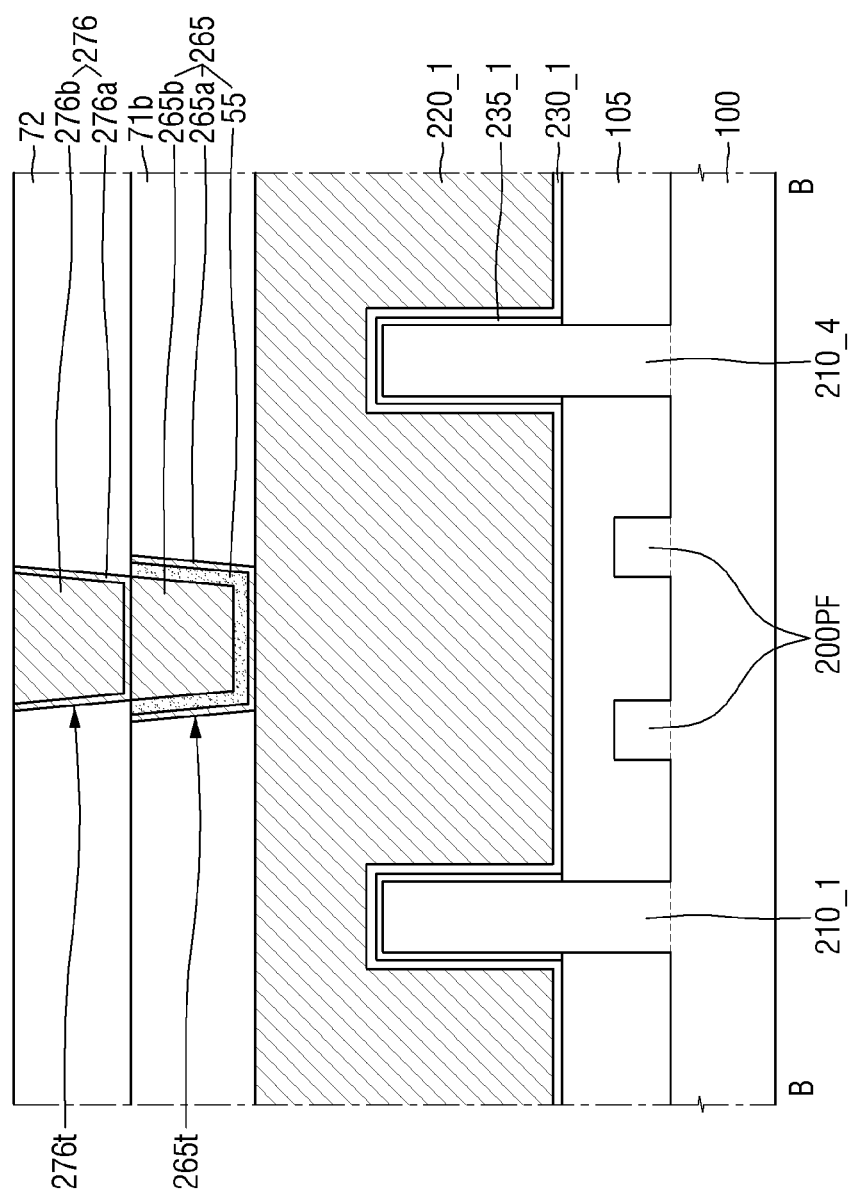
FIG. 17 is a diagram for explaining a semiconductor device according to some embodiments of the present disclosure.

FIG. 16 is a diagram for explaining the semiconductor device according to some embodiments of the present disclosure. FIG. 17 is a diagram for explaining the semiconductor device according to some embodiments of the present disclosure. For the sake of convenience of explanation, differences from those described using FIGS. 9 to 12 will be mainly described.

Referring to FIG. 16, in the semiconductor device according to some embodiments of the present disclosure, the first active region ACT1 and the second active region ACT2 may be defined by a deep trench DT.

In another way, a portion in which the deep trench DT is formed may be a field region FX.

The deep trench DT is deeper than a trench defining the fin type patterns 210_1 and 210_4.

Referring to FIG. 17, in the semiconductor device according to some embodiments of the present disclosure, a protruding pattern 200PF protruding from the substrate 100 may be formed in the field region FX.

The field insulating layer 105 may cover the upper surface of the protruding pattern 200PF. That is, the upper surface of the protruding pattern 200PF does not protrude above the upper surface of the field insulating layer 105.

Figure 18:
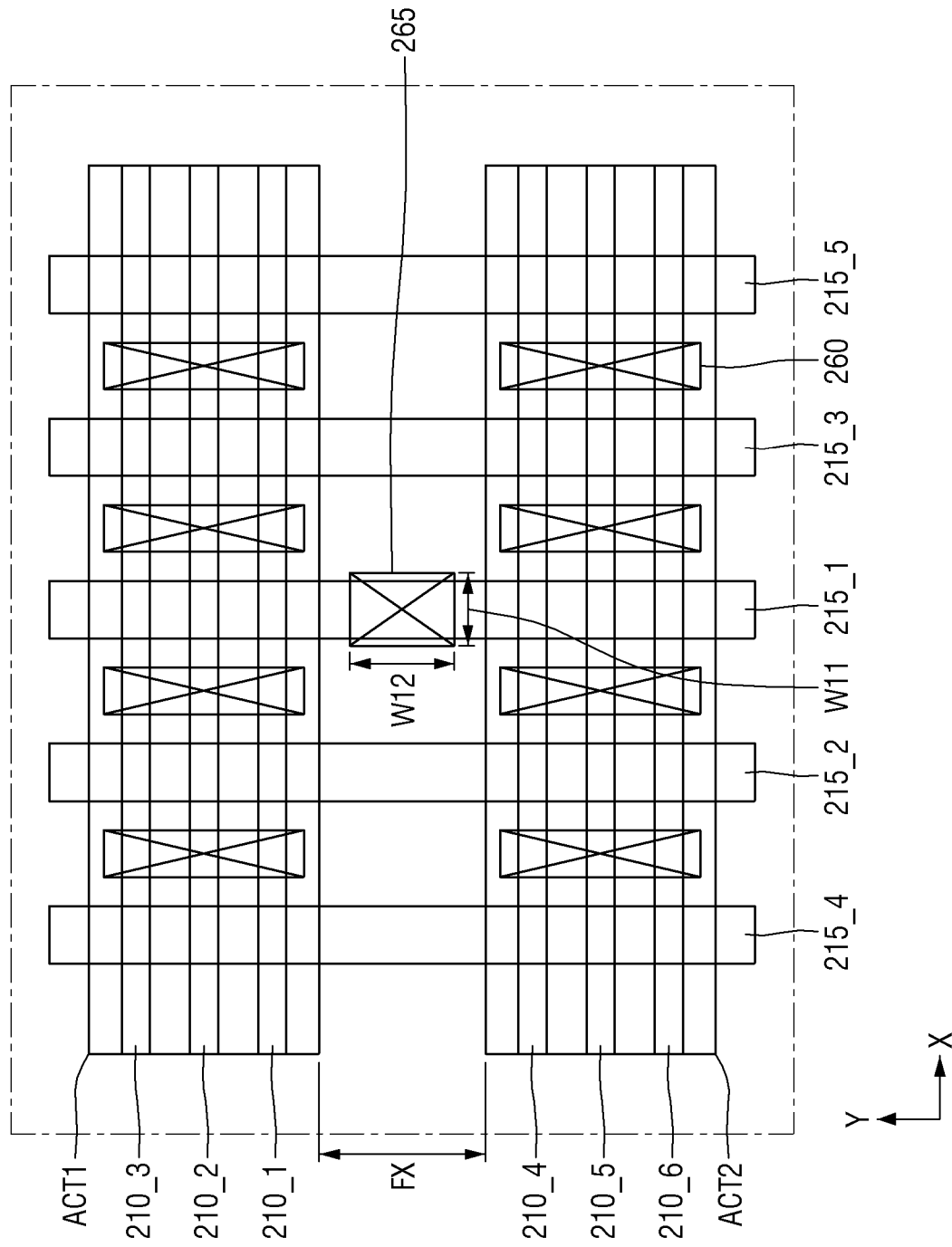
FIG. 18 is a layout diagram for explaining a semiconductor device according to some embodiments of the present disclosure.
Figure 19:
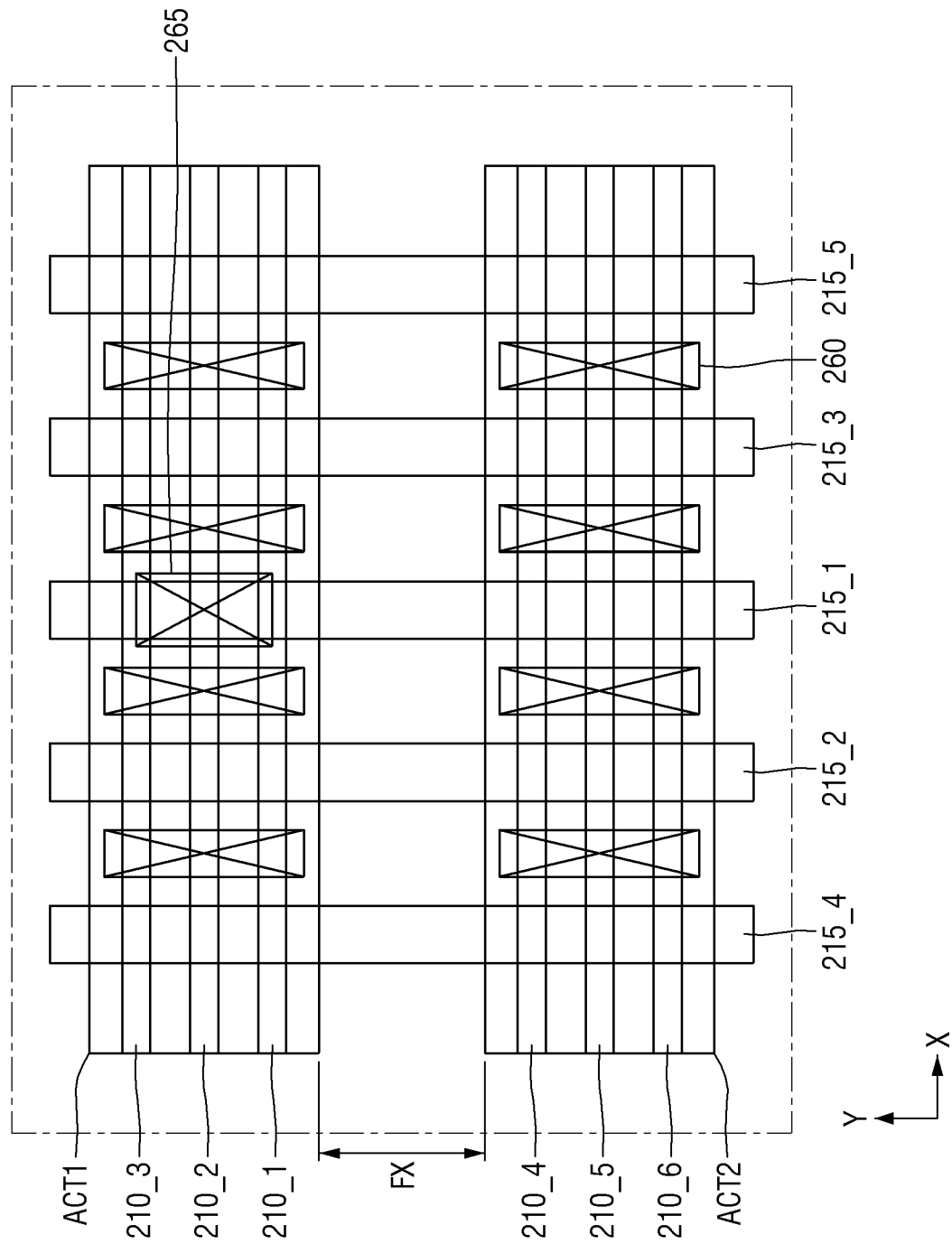
FIG. 19 is a layout diagram for explaining a semiconductor device according to some embodiments of the present disclosure.
Figure 20:
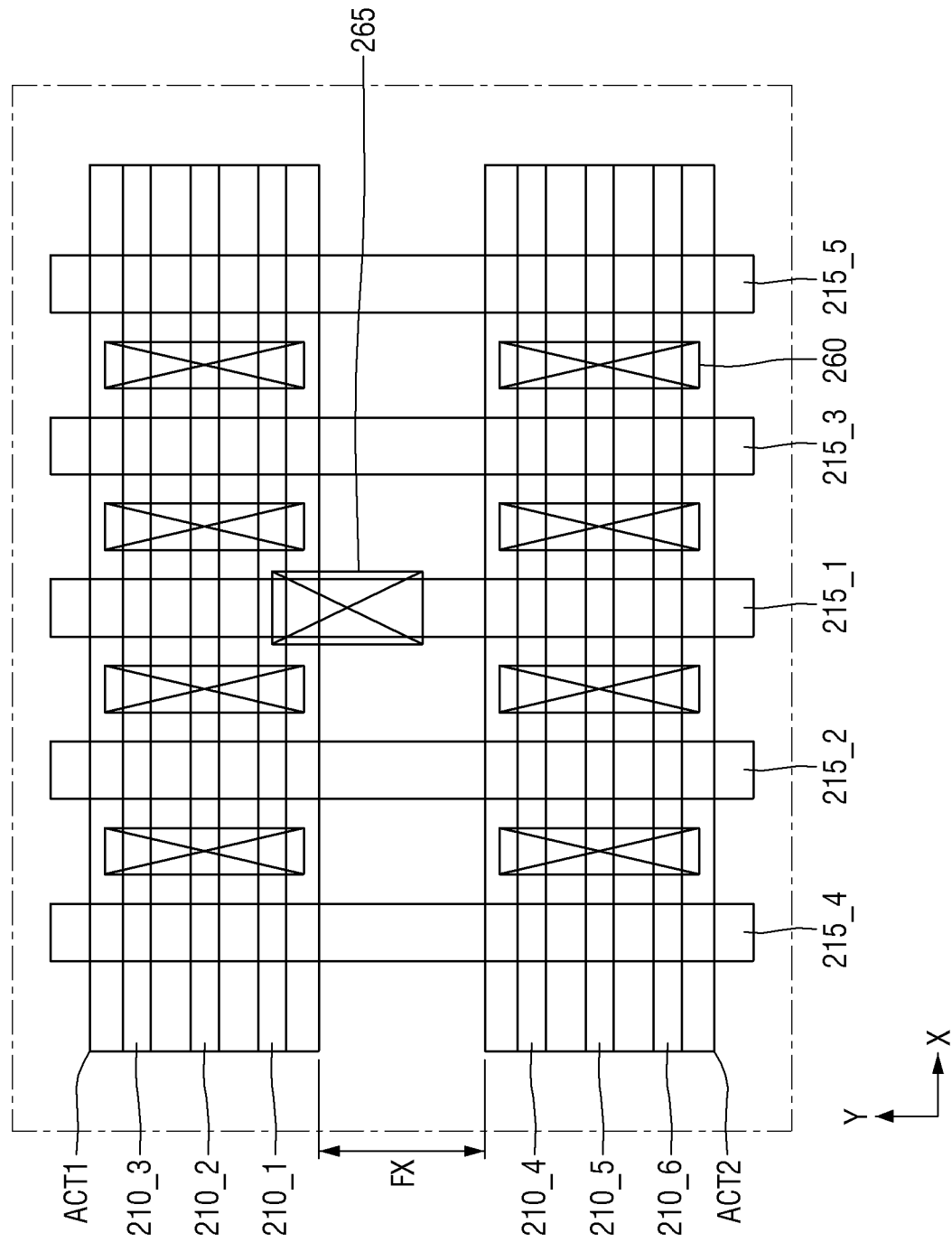
FIG. 20 is a layout diagram for explaining a semiconductor device according to some embodiments of the present disclosure.

FIG. 18 is a layout diagram for explaining a semiconductor device according to some embodiments of the present disclosure. FIG. 19 is a layout diagram for explaining a semiconductor device according to some embodiments of the present disclosure. FIG. 20 is a layout diagram for explaining a semiconductor device according to some embodiments of the present disclosure. For the sake of convenience of explanation, differences from those described using FIGS. 9 to 12 will be mainly described, and the via plug (276 of FIG. 9) is not illustrated in FIGS. 18 to 20.

Referring to FIG. 18, in the semiconductor device according to some embodiments of the present disclosure, the second gate contact plug 265 may extend long in the second direction Y.

The width W11 of the second gate contact plug 265 in the first direction X may be smaller than the width W12 of the second gate contact plug 265 in the second direction Y.

Referring to FIG. 19, in the semiconductor device according to some embodiments of the present disclosure, the second gate contact plug 265 may be formed on the substrate 100 of the first active region ACT1.

The second gate contact plug 265 may be disposed between the second source/drain contact plugs 260 adjacent to each other.

Referring to FIG. 20, in the semiconductor device according to some embodiments of the present disclosure, the second gate contact plug 265 may be formed over the first active region ACT1 and the field region FX.

A part of the second gate contact plug 265 may be formed on the substrate 100 of the field region FX. The remaining parts of the second gate contact plug 265 may be formed on the substrate 100 of the first active region ACT1.

Figure 21:
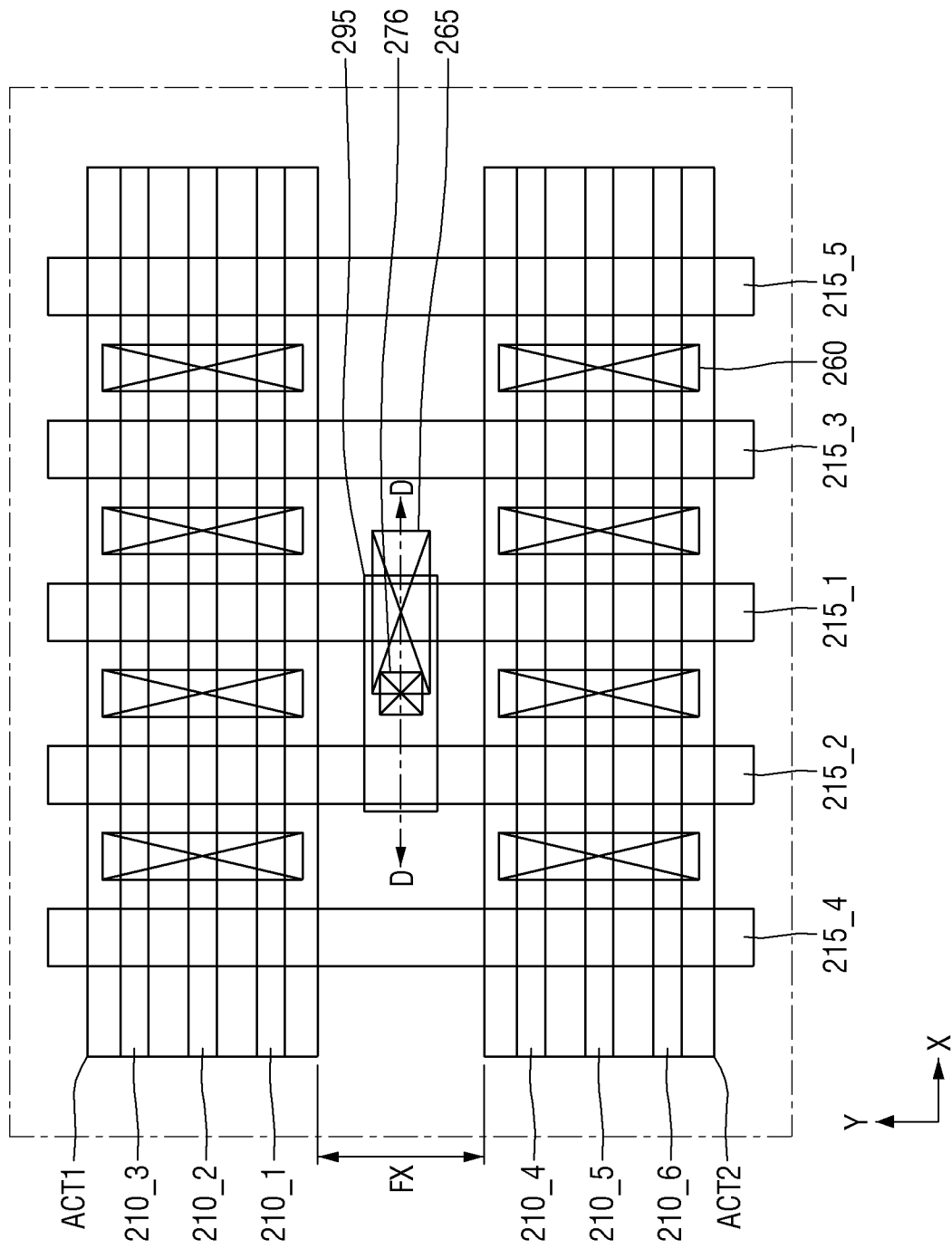
FIG. 21 is a layout diagram for explaining a semiconductor device according to some embodiments of the present disclosure.
Figure 22:
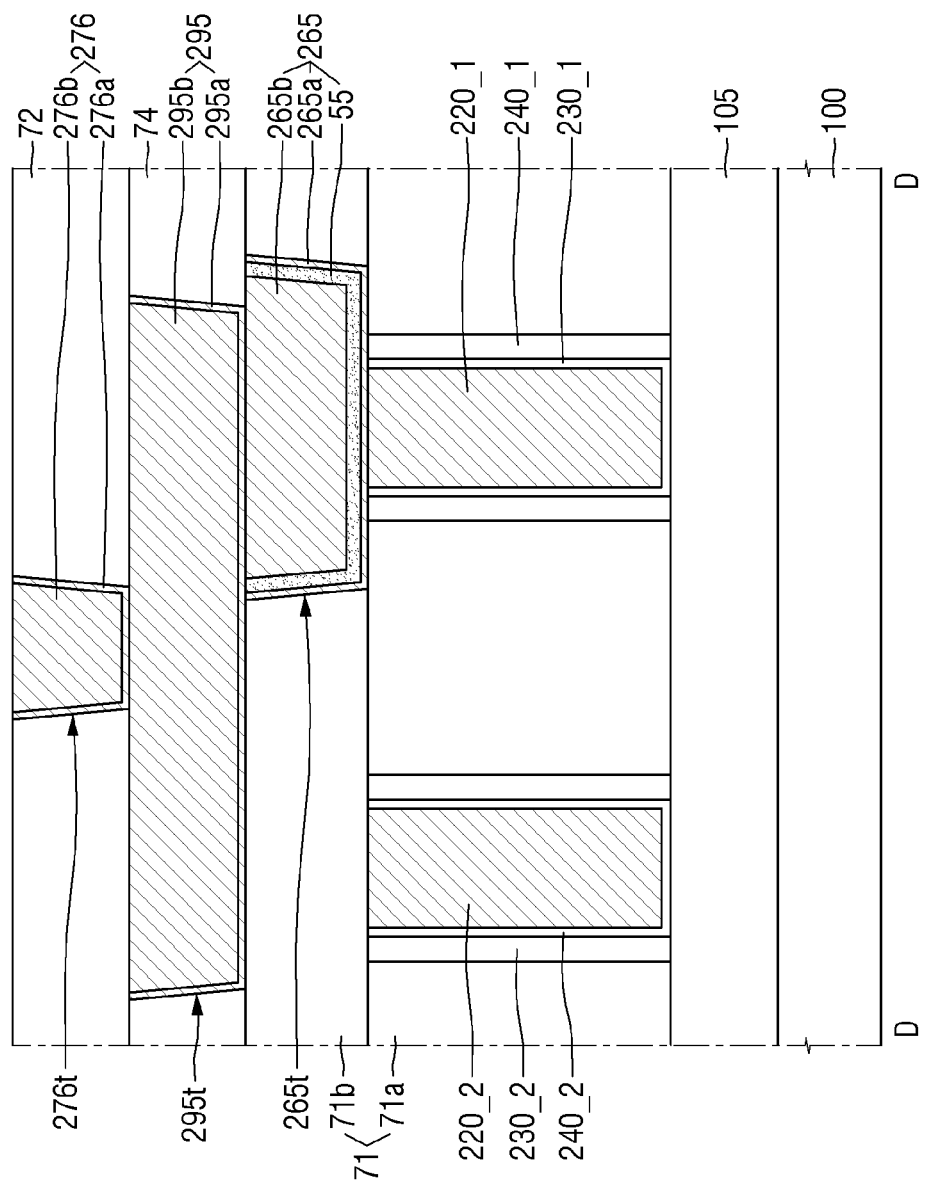
FIG. 22 is a cross-sectional view taken along line D-D of FIG. 21.

FIG. 21 is a layout diagram for explaining a semiconductor device according to some embodiments of the present disclosure. FIG. 22 is a cross-sectional view taken along line D-D of FIG. 21. For the sake of convenience of explanation, differences from those described using FIGS. 9 to 12 will be mainly described.

Referring to FIGS. 21 and 22, the semiconductor device according to some embodiments of the present disclosure may further include a third insertion wiring 295.

The third insertion wiring 295 may be disposed between the second gate contact plug 265 and the via plug 276. The third insertion wiring 295 may be connected to the second gate contact plug 265 and the via plug 276. The third insertion wiring 295 may be in contact with the second gate contact plug 265.

The third insertion wiring 295 may be formed in a third insertion wiring trench 295t inside an insertion interlayer insulating layer 74. The third insertion wiring trench 295t may expose the second gate contact plug 265.

The third insertion wiring 295 may include a third insertion wiring barrier layer 295a and a third insertion wiring filling layer 295b on the second gate contact plug 265. The third insertion wiring barrier layer 295a may extend along the sidewalls and the bottom surface of the third insertion wiring trench 295t. The third insertion wiring filling layer 295b may be formed on the third insertion wiring barrier layer 295a.

The third insertion wiring 295 may be formed over at least two or more second gate structures 215_1 and 215_2. For example, the third insertion wiring 295 may extend onto the upper surface of the second gate structure 215_1 connected to the second gate contact plug 265 and onto the upper surface of the adjacent second gate structure 215_2.

In an example embodiment, a part of the third insertion wiring 295 may extend onto the upper surface of the second gate structure 215_1 connected to the second gate contact plug 265. Another part of the third insertion wiring 295 may extend onto the upper surface of the adjacent second gate structure 215_2.

The via plug 276 may be disposed on the substrate 100 between the second gate structures 215_1 and 215_2 adjacent to each other, but is not limited thereto.

Unlike the illustrated case, the third insertion wiring 295 may also be formed over three or more second gate structures 215_1, 215_2, 215_3, 215_4 and 215_5.

Figure 23:
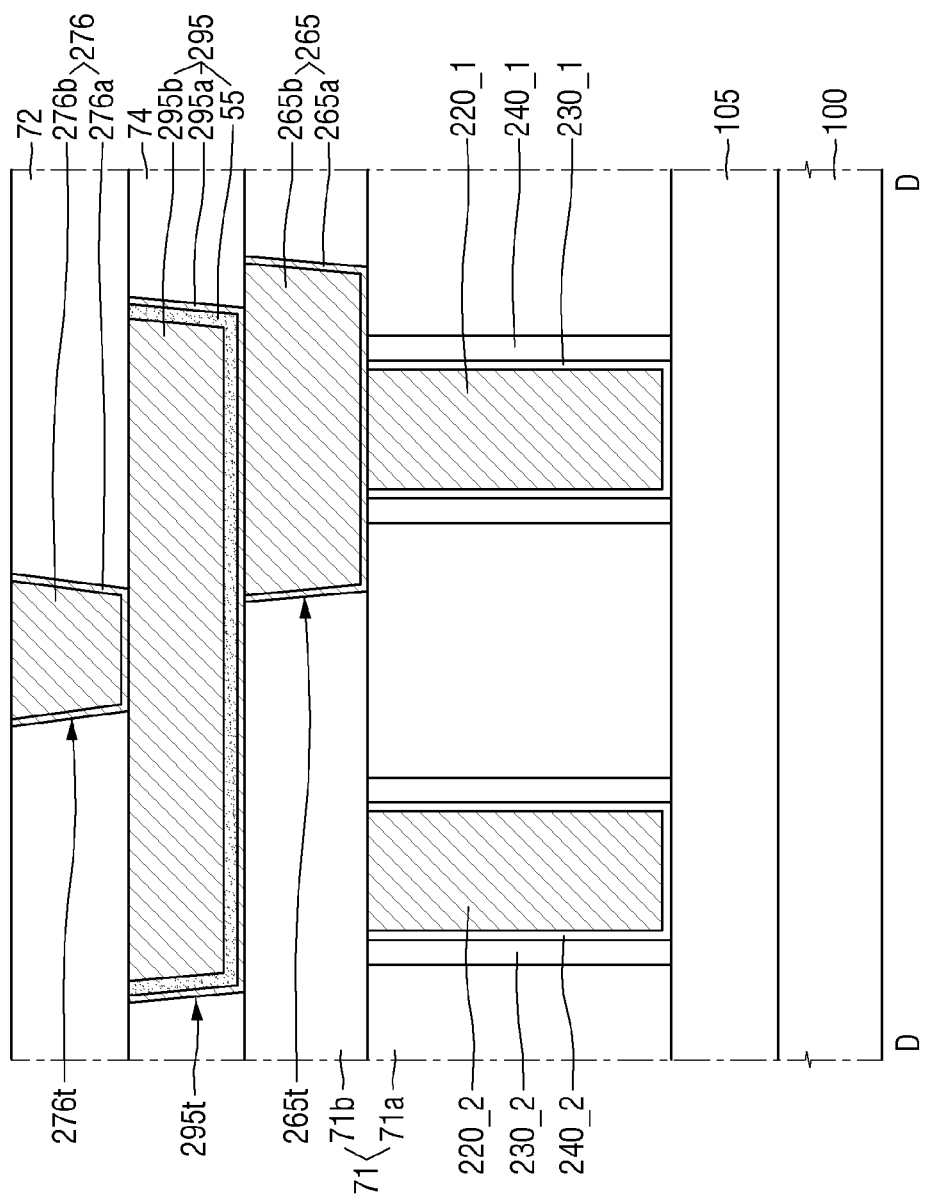
FIG. 23 is a diagram for explaining a semiconductor device according to some embodiments of the present disclosure.

FIG. 23 is a diagram for explaining a semiconductor device according to some embodiments of the present disclosure. For the sake of convenience of explanation, differences from those described using FIG. 21 and FIG. 22 will be mainly described.

Referring to FIG. 23, in the semiconductor device according to some embodiments of the present disclosure, the third insertion wiring 295 may include a second ferroelectric material layer 55.

A ferroelectric capacitor may be defined by disposing the second ferroelectric material layer 55 between the third insertion wiring barrier layer 295a and the third insertion wiring filling layer 295b.

Unlike the illustrated case, the ferroelectric capacitor may be defined by disposing the second ferroelectric material layer 55 between the third insertion wiring barrier layer 295a and the second gate contact plug 265.

Figure 24:
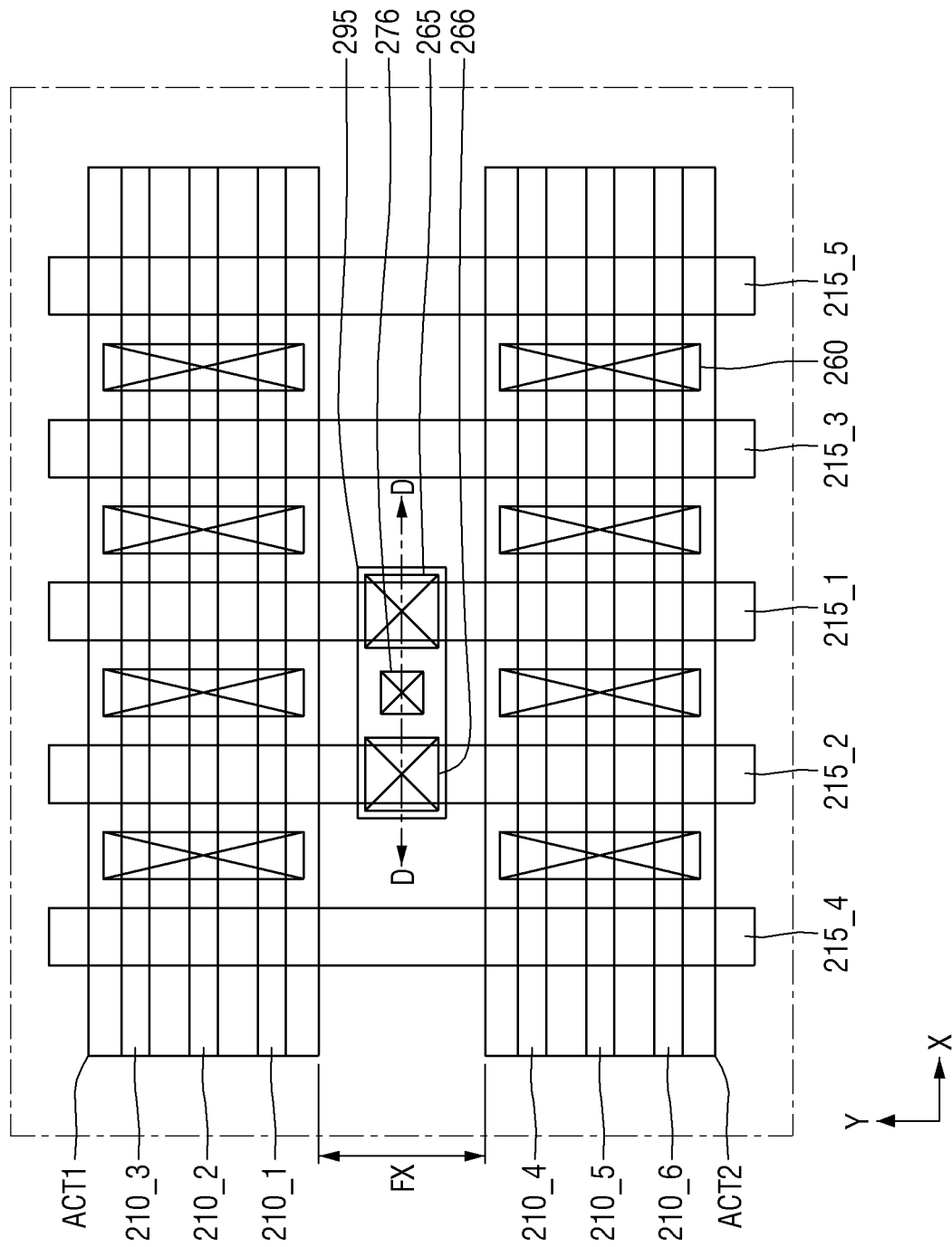
FIG. 24 is a layout diagram for explaining a semiconductor device according to some embodiments of the present disclosure.
Figure 25:
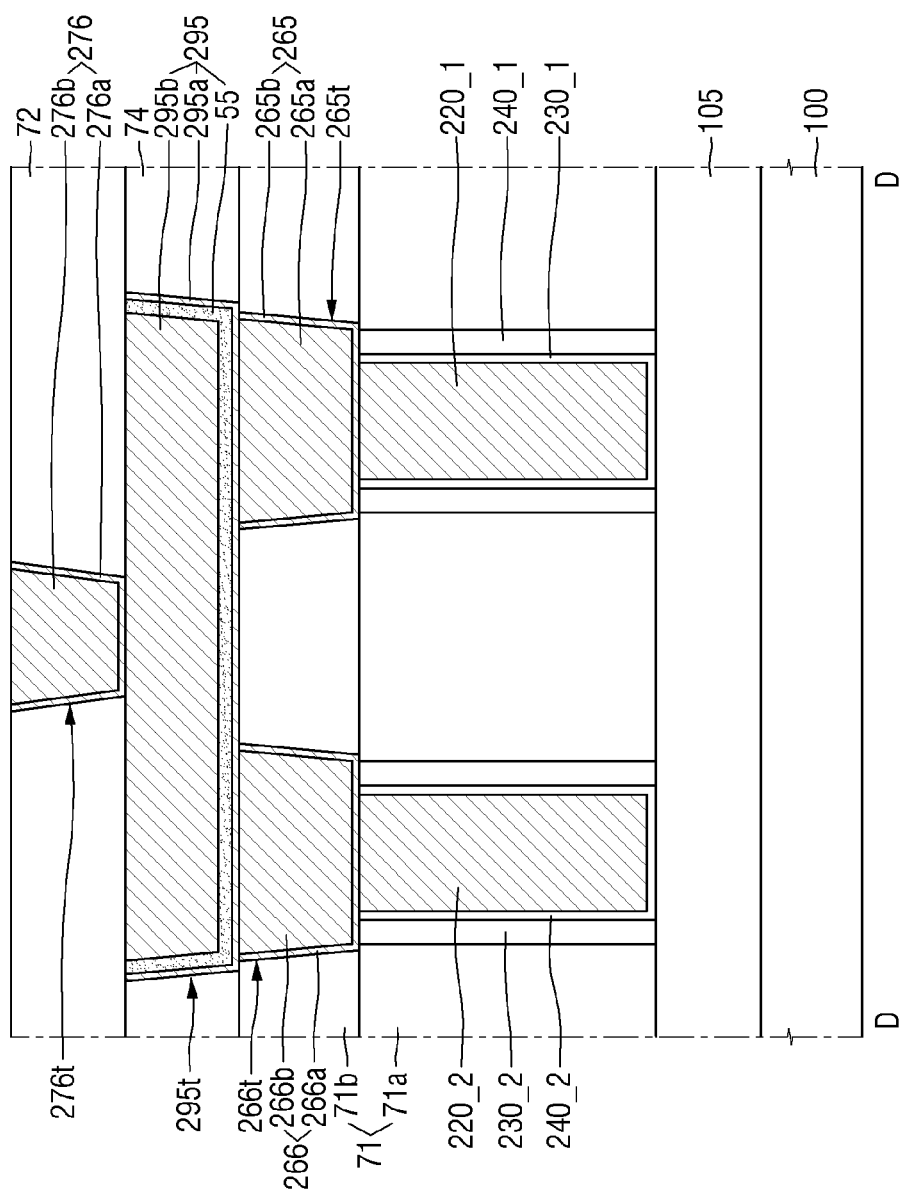
FIG. 25 is a cross-sectional view taken along line D-D of FIG. 24.

FIG. 24 is a layout diagram for explaining a semiconductor device according to some embodiments of the present disclosure. FIG. 25 is a cross-sectional view taken along line D-D of FIG. 24. For the sake of convenience of explanation, differences from those described using FIGS. 21 and 23 will be mainly described.

Referring to FIGS. 24 and 25, the semiconductor device according to some embodiments of the present disclosure may further include a third gate contact plugs 266 disposed between the third insertion wiring 295 and the second gate structure 215_2.

The third gate contact plug 266 may be formed on the second gate electrode 220_2. The third gate contact plug 266 may be connected to the second gate electrode 220_2. The third gate contact plug 266 may be in contact with the second gate electrode 220_2.

The third gate contact plug 266 may be formed in a third gate contact hole 266t inside the first upper interlayer insulating layer 71b. The third gate contact hole 266t may expose a part of the second gate electrode 220_2.

The third gate contact plug 266 may include a third gate contact barrier layer 266a and a third gate contact filling layer 266b on the second gate electrode 220_2. The upper surface of the third gate contact plug 266 is higher than the upper surface of the second gate structure 215_2.

The third gate contact barrier layer 266a may extend along the sidewalls and the bottom surface of the third gate contact hole 266t. The third gate contact filling layer 266b may be formed on the third gate contact barrier layer 266a. The third gate contact filling layer 266b may fill the third gate contact hole 266t.

The third gate contact plug 266 may be connected to the third insertion wiring 295.

Unlike the case described in FIGS. 9 to 25, the second ferroelectric material layer 55 may be included in at least one place of the via plug and the interlayer wiring formed in a BEOL process, as described in FIGS. 3 to 6.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor device comprising:
   a substrate;
   a gate structure on the substrate, the gate structure including a gate spacer and a gate electrode, the gate electrode extending in a first direction and having a first portion on an active region of the substrate and a second portion on a field region of the substrate; and
   a first conductive connection group on the first portion of the gate electrode of the gate structure, the first conductive connection group including a ferroelectric material layer,
   wherein at least a part of the ferroelectric material layer is disposed above an upper surface of the gate spacer, and the ferroelectric material layer is configured to form a ferroelectric capacitor having a negative capacitance in the first conductive connection group,
   wherein the first conductive connection group includes a gate contact plug being in contact with the gate electrode, and
   wherein a first width of the gate contact plug in the first direction is smaller than a width of the first portion of the gate electrode in the first direction.

2. The semiconductor device of claim 1,
   wherein the first conductive connection group is in contact with the gate electrode.

3. The semiconductor device of claim 2, further comprising:
   a source/drain region disposed on a region adjacent to at least one side of the gate structure; and
   a source/drain contact plug connected to the source/drain region,
   wherein the first conductive connection group includes a gate contact plug, and
   an upper surface of the source/drain contact plug is positioned at substantially the same height as an upper surface of the gate contact plug from an upper surface of the substrate.

4. The semiconductor device of claim 1,
   wherein the gate contact plug includes the ferroelectric material layer.

5. The semiconductor device of claim 4,
   wherein the gate contact plug further includes a barrier conductive layer and a filling conductive layer, and
   the ferroelectric material layer is disposed between the barrier conductive layer and the filling conductive layer.

6. The semiconductor device of claim 1,
   wherein the first conductive connection group further includes a first via plug and a first interlayer wiring, the first via plug is in contact with the gate contact plug, and the first via plug includes the ferroelectric material layer.

7. The semiconductor device of claim 6,
wherein the first conductive connection group further includes a second via plug and a second interlayer wiring above the first interlayer wiring.

8. The semiconductor device of claim 1,
wherein the first conductive connection group further includes a via plug and an interlayer wiring on the gate contact plug, the via plug being in contact with the gate contact plug,
the via plug includes a first filling conductive layer and the ferroelectric material layer, and
the interlayer wiring includes a second filling conductive layer connected to the first filling conductive layer.

9. The semiconductor device of claim 1, further comprising:
a source/drain region disposed in a region of the substrate adjacent to at least one side of the gate structure; and
a second conductive connection group connected to the source/drain region,
wherein the second conductive connection group does not contain a ferroelectric material layer.

10. A semiconductor device comprising:
a substrate with an active region and a field region defining the active region;
a gate structure including a gate electrode, the gate electrode having a first portion on the active region of the substrate and a second portion on the field region of the substrate;
a source/drain region disposed in a region of the substrate directly adjacent to at least one side of the gate structure;
a first conductive connection group on the first portion of the gate electrode, the first conductive connection group being connected to the first portion of the gate electrode and including a ferroelectric material layer; and
a second conductive connection group, without connection to the first conductive connection group, connected to the source/drain region and disposed on the source/drain region,
wherein the first conductive connection group includes a gate contact plug being in contact with the gate electrode,
the second conductive connection group includes a source/drain contact plug being in contact with the source/drain region,
an upper surface of the gate contact plug is positioned at substantially the same height as an upper surface of the source/drain contact plug from an upper surface of the substrate, and
a height from an upper surface of the gate structure to an uppermost surface of the ferroelectric material layer is equal to or greater than a height from the upper surface of the gate structure to the upper surface of the source/drain contact plug.

11. The semiconductor device of claim 10,
wherein the second conductive connection group does not include a ferroelectric material layer.

12. The semiconductor device of claim 10,
wherein the gate contact plug includes the ferroelectric material layer.

13. The semiconductor device of claim 10,
wherein the first conductive connection group includes a via plug and an interlayer wiring connected to the gate contact plug, and
the ferroelectric material layer is included in at least one of the via plug and the interlayer wiring.

14. A semiconductor device comprising:
a substrate including an active region and a field region;
a first gate electrode on the substrate, the first gate electrode extending over the active region and the field region in a first direction and including a first portion on the active region and a second portion on the field region; and
a first gate contact plug on the first portion of the first gate electrode, the first gate contact plug being connected to the first gate electrode and including a ferroelectric material layer,
wherein a first width of the first gate contact plug in the first direction is smaller than a width of the first portion of the first gate electrode in the first direction.

15. The semiconductor device of claim 14,
wherein a second width that the first gate contact plug has in a second direction crossing the first direction is smaller than the first width that the first gate contact plug has in the first direction.

16. The semiconductor device of claim 14,
wherein a second width that the first gate contact plug has in a second direction crossing the first direction is greater than the first width that the first gate contact plug has in the first direction.

17. The semiconductor device of claim 14,
wherein the first gate contact plug is in contact with the first gate electrode.

18. The semiconductor device of claim 14, further comprising:
a via plug on the first gate contact plug; and
an insertion wiring disposed between the first gate contact plug and the via plug.

19. The semiconductor device of claim 18, further comprising:
a second gate electrode extending over the active region and the field region in the first direction; and
a second gate contact plug on the second gate electrode,
wherein the insertion wiring is further disposed between the second gate contact plug and the via plug and connects the second gate contact plug to the first gate contact plug.

* * * * *